(12) United States Patent  
Sawada et al.

(10) Patent No.: US 6,406,326 B2  
(45) Date of Patent: Jun. 18, 2002

(54) WIRE HOLDING STRUCTURE

(75) Inventors: Yoshitsugu Sawada; Takuya Hasegawa, both of Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/887,003

(22) Filed: Jun. 25, 2001

(30) Foreign Application Priority Data

Jun. 26, 2000 (JP) ......................................... 2000-191496  
Jun. 26, 2000 (JP) ......................................... 2000-191497

(51) Int. Cl.[7] ............................................. H01R 13/56  
(52) U.S. Cl. ........................................ 439/449; 439/460  
(58) Field of Search ................................ 439/449, 459, 439/460, 468, 392, 395, 399, 400, 401, 402, 403, 404, 407, 438, 440, 452

(56) References Cited

U.S. PATENT DOCUMENTS

| 5,030,136 A | | 7/1991 | Reinhardt et al. | 439/460 |
| 5,073,126 A | * | 12/1991 | Kikuchi et al. | 439/452 |
| 5,547,391 A | * | 8/1996 | Benes et al. | 439/399 |
| 5,577,930 A | * | 11/1996 | Dehlem et al. | 439/399 |
| 5,591,045 A | * | 1/1997 | Pepe et al. | 439/460 |
| 5,681,181 A | * | 10/1997 | Atsumi | 439/404 |
| 5,951,319 A | * | 9/1999 | Lin | 439/395 |

FOREIGN PATENT DOCUMENTS

JP  2-295074  12/1990  ............. H01R/4/24

* cited by examiner

Primary Examiner—Tulsidas Patel  
(74) Attorney, Agent, or Firm—Sughrue Mion, PLLC

(57) ABSTRACT

In a wire holding structure (20), first wire gripping piece portions (23) for a thick wire, having a relatively wide slot width (A), and second wire gripping piece portions (25) for a thin wire, having a relatively narrow slot width (D), are provided on a wire receiving groove (22) in a wiring board (21), and are disposed adjacent to each other. A gripping piece portion-interconnecting portion (27), interconnecting the wire gripping piece portions, is provided at a region disposed between and below each pair of wire gripping piece portions (23, 25). A centerline between the first wire gripping piece portions (23) and a centerline between the second wire gripping piece portions (25) coincide with a centerline of the wire receiving groove (22).

8 Claims, 20 Drawing Sheets

WIRE HOLDING STRUCTURE

BACKGROUND OF THE INVENTION

1. Field of the Invention

The present invention relates to a wire holding structure which is formed within a housing of a connector, used for electrically connecting a wire harness in a vehicle such as an automobile, or on a wiring board forming a predetermined circuit within an electric connection box. More specifically, the present invention relates to a wire holding structure having wire gripping piece portions capable of gripping various wires of different diameters rapidly and positively.

The present invention is based on Japanese Patent Application Nos. 2000-191496 and 2000-191497, the contents of which are incorporated herein by reference.

2. Description of the Related Art

In a vehicle having various electronic equipments mounted thereon, many connectors have been used for electrically connecting the electronic equipments together and for connecting a wire harness to the electronic equipment. Such connector is disclosed, for example, in Unexamined Japanese Patent Publication No. Hei. 2-295074. As shown in FIGS. 1 and 2, there is known a connector 10 including a plate-like housing 11 having wire receiving grooves 12, wire severing blades 13, sheath cutting blades 14 and wire gripping piece portions 16 (the associated wire receiving groove 12, wire cutting blade 13, sheath cutting blade 14 and wire gripping piece portions 16 are arranged sequentially in this order on a straight line), and a sheathed wire 1, having a sheath 2, is inserted in the housing 11.

In the connector 10, the wire cutting blade 13 for cutting an end portion of the wire 1 is made of metal, and is insert molded in the housing, and the sheath cutting blade 14, made of metal, is separate from the plate-like housing 11, and is formed by a bending operation. Part of a function of a so-called press-connecting terminal is incorporated in the housing, and the sheath cutting blade 14 has a generally U-shaped opposition space, and when the sheath 2 of the sheathed wire 1 is press-fitted into this U-shaped opposition space, the sheath 2 is cut by opposed edges thereof, so that the sheath cutting blade comes into contact with a conductor 3, thereby making electrical connection.

A rigidity of flexing of each wire gripping piece portion 16 toward the sheath cutting blade 14 is reduced by a vertical groove 15 formed between this portion 16 and the sheath cutting blade 14, an undercut portion 18 spaced from a bottom portion 12a of the wire receiving groove, and a chamfered portion 19 defining, together with its associated chambered portion 19, an inverted V-shaped opposition space 17. When the sheathed wire 1 is press-fitted into the opposition space 17, the wire gripping piece portions 16 grip the outer surface of the sheath 2 while deforming this sheath, and are elastically displaced toward the sheath cutting blade 14. The displacement of the wire gripping piece portions 16 away from the sheath cutting blade 14 is suppressed, thereby preventing the withdrawal of the sheathed wire 1 in an axial direction. And besides, the withdrawal of the sheathed wire 1 in an upward direction is prevented by the inverted V-shaped opposition space 17 formed between the wire gripping piece portions 16 and 16.

In the above-described connector 10, however, there was a possibility that the force of gripping of the sheathed wire 1 by the wire gripping piece portions 16, formed on the plate-like housing 11, was liable to decrease with the decrease of the flexural rigidity due to the vertical grooves 15, the undercut portions 19 and the chamfered portions 19.

And besides, when the bottom portion 12a of the wire receiving groove, forming a lower region of the inverted V-shaped opposition space 17, was warped upwardly into a convex shape, the opposition space 17 was expanded, which led to a possibility that the gripping force of the wire gripping piece portions 16 was further reduced.

Furthermore, the sheathed wire 1 is gripped by the pair of wire gripping piece portions 16 and 16, and therefore in the case where wires of various diameters were used, these wire gripping piece portions could not meet a variety of wire diameters since the opposition space 17 between the wire gripping piece portions 17 is fixed, and there was a possibility that there were needed various plate-like housings 11 each for exclusive use with the corresponding wire.

SUMMARY OF THE INVENTION

The present invention seeks to eliminate the undesirable possibilities of the above-described techniques, and an object of the present invention is to provide a wire holding structure capable of rapidly and positively holding wire shaving the relatively-wide range of wire diameters.

To achieve the above object, according to a first aspect of the present invention, there is provided a wire holding structure which comprises: a wiring board; a wire receiving groove, formed in the wiring board, for linearly mounting a sheathed wire therein; opposed wire gripping piece portions, for gripping the sheathed wire, provided in a predetermined position on the wire receiving groove; and an interconnecting portion interconnecting the wire gripping piece portions, the interconnecting portion being provided at a region below the wire gripping piece portions.

In the first aspect of the present invention, when inserting the sheathed wire between the wire gripping piece portions, the bottom portion of the wire receiving groove, forming the region disposed between and below the wire gripping piece portions, will not be warped upwardly, and therefore the opposition space between the wire gripping piece portions will not be expanded. Accordingly, the sheathed wire can be rapidly and firmly held between the wire gripping piece portions, thereby positively preventing the sheathed wire from being withdrawn in the axial direction and the upward direction.

Further, to achieve the above object, according to a second aspect of the present invention, there is provided a wire holding structure which comprises: a wiring board; a wire receiving groove, formed in the wiring board, for linearly mounting one of a thick sheathed wire and a thin sheathed wire therein; a pair of opposed, first wire gripping piece portions, for gripping the thick sheathed wire, provided in a first predetermined position on the wire receiving groove; a pair of opposed, second wire gripping piece portions, provided in a second predetermined position on the wire receiving groove, for gripping the thin sheathed wire, the second wire gripping piece portions being disposed adjacent to the first wire gripping piece portions, so that the first and second wire gripping piece portions are arranged serially on the wire receiving groove, wherein a centerline between the first wire gripping piece portions and a centerline between the second wire gripping piece portions coincide with each other; a first interconnecting portion interconnecting the first wire gripping piece portions, the first interconnecting portion being provided at a region below the first wire gripping piece portions; and a second interconnecting portion interconnecting the second wire gripping piece portions, the second interconnecting portion being provided at a region below the second wire gripping piece portions.

In the second aspect of the present invention, when inserting the sheathed wire between the first wire gripping piece portions or between the second wire gripping piece portions, the bottom portion of the wire receiving groove, forming the region disposed between and below the wire gripping piece portions, will not be warped upwardly, and therefore the opposition space will not be expanded. Therefore, the sheathed wire can be rapidly and firmly held between the first or the second wire gripping piece portions, thereby positively preventing the sheathed wire from being withdrawn in the axial direction and the upward direction.

Moreover, the portion of the wire holding structure for gripping a sheathed wire is divided into the first wire gripping piece portions for the thick wire and the second wire gripping piece portions for the thin wire in accordance with the outer diameter of the sheathed wire. Therefore, at least two wire diameters can be used, and a selected one of the sheathed wires of different diameters can be positively held between the corresponding wire gripping piece portions.

According to a third aspect of the present invention, it is preferable that the second wire gripping piece portions can have an increased width therebetween for corresponding to a width between the first wire gripping piece portions.

In the third aspect of the present invention, the opposed width between the second wire gripping piece portions can be increased to correspond to the opposed width between the first wire gripping piece portions, and therefore when inserting the thick sheathed wire, the wire is inserted between the first wire gripping piece portions, and the opposed width of the second wire gripping piece portions is increased to correspond to the opposed width of the first wire gripping piece portions by cutting the inner end portions of the second wire gripping piece portions.

By doing so, the thick sheathed wire can be inserted also between the second wire gripping piece portions.

Further, to achieve the above object, according to a fourth aspect of the present invention, there is provided a wire holding structure which comprises: a wiring board; a wire receiving groove, formed in the wiring board, for linearly mounting one of a thick sheathed wire and a thin sheathed wire therein; a pair of opposed, first wire gripping piece portions, for gripping the thick sheathed wire, provided in a first predetermined position on the wire receiving groove; and a pair of opposed, second wire gripping piece portions, provided in a second predetermined position on the wire receiving groove, for gripping the thin sheathed wire, the second wire gripping piece portions being disposed adjacent to the first wire gripping piece portions, so that the first and second wire gripping piece portions are arranged serially on the wire receiving groove, wherein a centerline between the first wire gripping piece portions and a centerline between the second wire gripping piece portions coincide with each other, and wherein an opening is formed in a bottom surface of the wire receiving groove.

In the fourth aspect of the present invention, the portion of the wire holding structure for gripping a sheathed wire is divided into the first wire gripping piece portions for the thick wire and the second wire gripping piece portions for the thin wire in accordance with the outer diameter of the sheathed wire. Further, the first and second wire gripping piece portions are arranged serially on the wire receiving groove, so that the centerline between the first wire gripping piece portions and the centerline between the second wire gripping piece portions coincide with each other. Therefore, at least two wire diameters can be used, and a selected one of the sheathed wires of different diameters can be positively held between the corresponding wire gripping piece portions in a properly-gripped condition.

Moreover, since the opening is formed in the bottom surface of the wire receiving groove, the cutting pieces of the second wire gripping piece portions can be discharged through this opening. Accordingly, the thick sheathed wire can be rapidly and firmly held, and is positively prevented from being withdrawn in the longitudinal direction of the wire receiving groove and the upward direction.

According to a fifth aspect of the present invention depending on the fourth aspect, it is preferable that the second wire gripping piece portions can have an increased width therebetween for corresponding to a width between the first wire gripping piece portions.

In the fifth aspect of the present invention, the opposed width between the second wire gripping piece portions can be increased to correspond to the opposed width between the first wire gripping piece portions, and therefore when inserting the thick sheathed wire, the wire is inserted between the first wire gripping piece portions, and the opposed width of the second wire gripping piece portions is increased to correspond to the opposed width of the first wire gripping piece portions by cutting the inner end portions of the second wire gripping piece portions. By doing so, the thick sheathed wire can be inserted also between the second wire gripping piece portions.

Further, to achieve the above object, according to a sixth aspect of the present invention, there is provided a wire holding structure which comprises: a wiring board; a wire receiving groove, formed in the wiring board, for linearly mounting one of a thick sheathed wire and a thin sheathed wire therein; two pairs of opposed, first wire gripping piece portions, for gripping the thick sheathed wire, provided in first predetermined positions on the wire receiving groove; and two pair of opposed, second wire gripping piece portions, provided in second predetermined positions on the wire receiving groove, for gripping the thin sheathed wire, the second wire gripping piece portions being disposed adjacent to the first wire gripping piece portions, so that the first and second wire gripping piece portions are arranged serially on the wire receiving groove, wherein a centerline between the respective first wire gripping piece portions and a centerline between the respective second wire gripping piece portions coincide with each other, and wherein an opening is formed in a bottom surface of the wire receiving groove.

In the sixth aspect of the present invention, the two pairs of first wire gripping piece portions and the two pairs of second wire gripping piece portions are provided. Therefore, when either of the thick sheathed wire and the thin sheathed wire is inserted, the wire can be more firmly held in the wire receiving groove. Accordingly, various kinds of sheathed wires of different diameters can be firmly held, and the wire is prevented from being withdrawn in the longitudinal direction of the wire receiving groove and the upward direction. Thus, the wire holding structure of high reliability for a wiring board and others can be obtained.

According to a seventh aspect of the present invention depending on the sixth aspect, it is preferable that each pair of the second wire gripping piece portions can have an increased width therebetween for corresponding to a width between each pair of the first wire gripping piece portions.

In the seventh aspect of the present invention, the opposed width between each pair of the second wire gripping piece portions can be increased to correspond to the opposed width between each pair of the first wire gripping piece portions, and therefore when inserting the thick sheathed wire, the wire is inserted between each pair of the first wire gripping piece portions, and the opposed width of each pair of the second wire gripping piece portions is increased to correspond to the opposed width of each pair of the first wire gripping piece portions by cutting the inner end portions of the second wire gripping piece portions.

By doing so, the thick sheathed wire can be inserted also between the second wire gripping piece portions.

BRIEF DESCRIPTION OF THE DRAWINGS

The above and other objects and advantages of the present invention will become more apparent by describing in detail preferred embodiments thereof with reference to the accompanying drawings, wherein.

DETAILED DESCRIPTION OF THE PREFERRED EMBODIMENTS

Preferred embodiments of wire holding structures of the present invention will now be described in detail with reference to the accompanying drawings.

1. First Embodiment

A first embodiment of a wire holding structure of the present invention will now be described in detail with reference to FIGS. 3 to 9.

Figure 1:
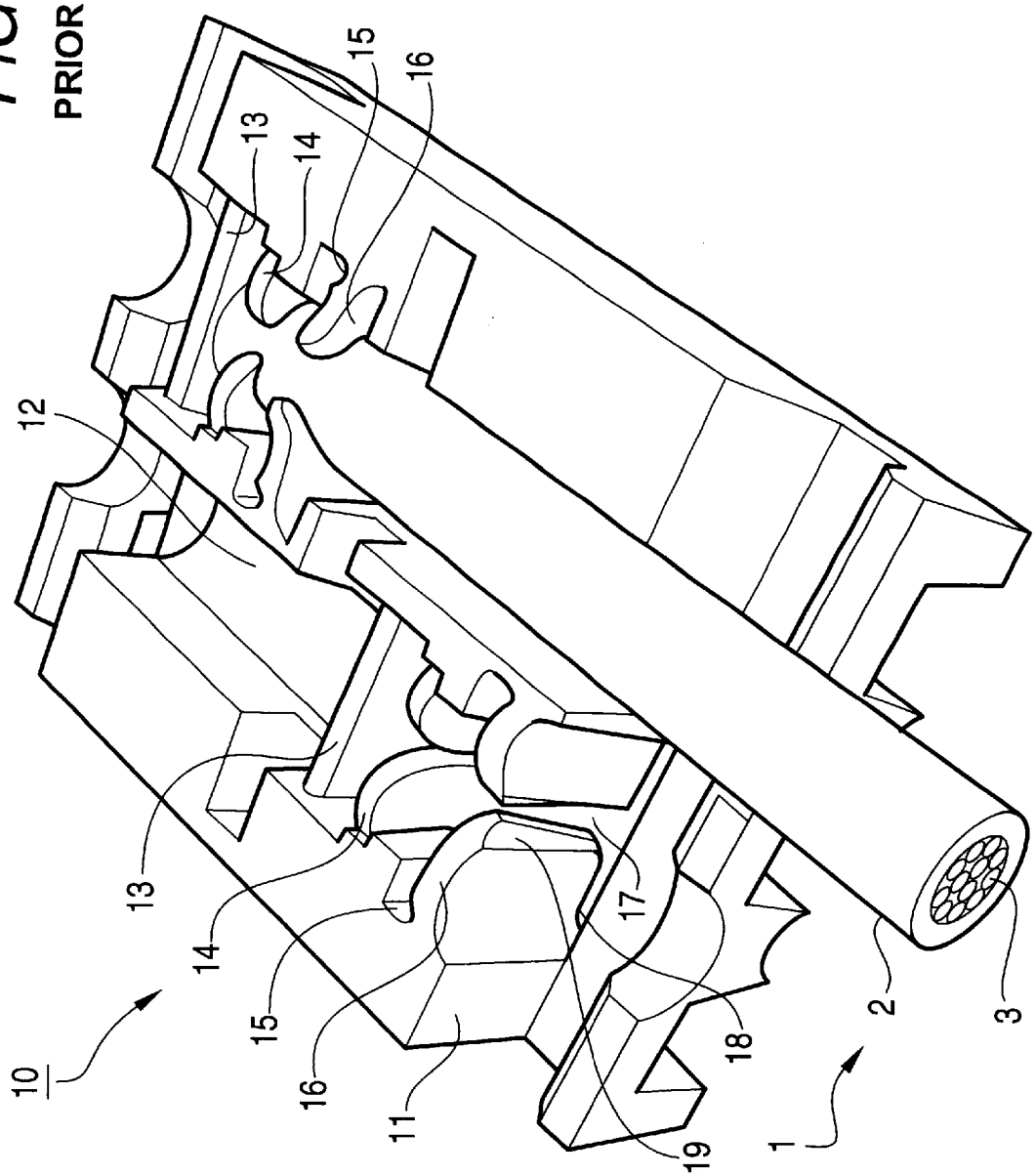
FIG. 1 is a perspective view showing an important portion of a related connector.
Figure 2:
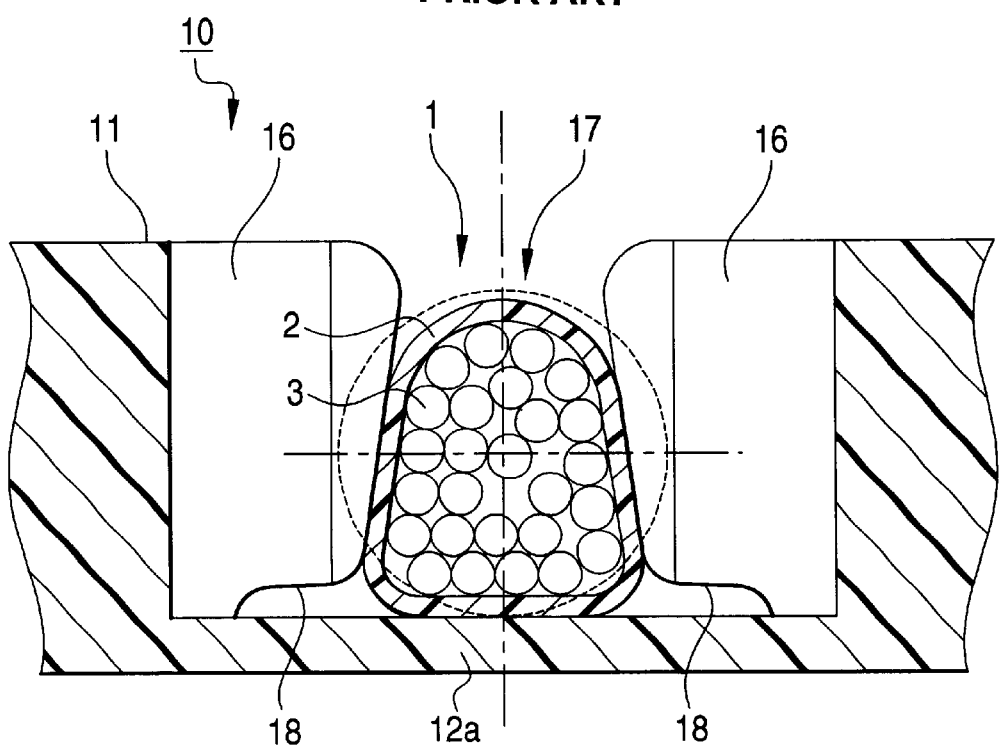
FIG. 2 is a cross-sectional view of the connector of FIG. 1.
Figure 3:
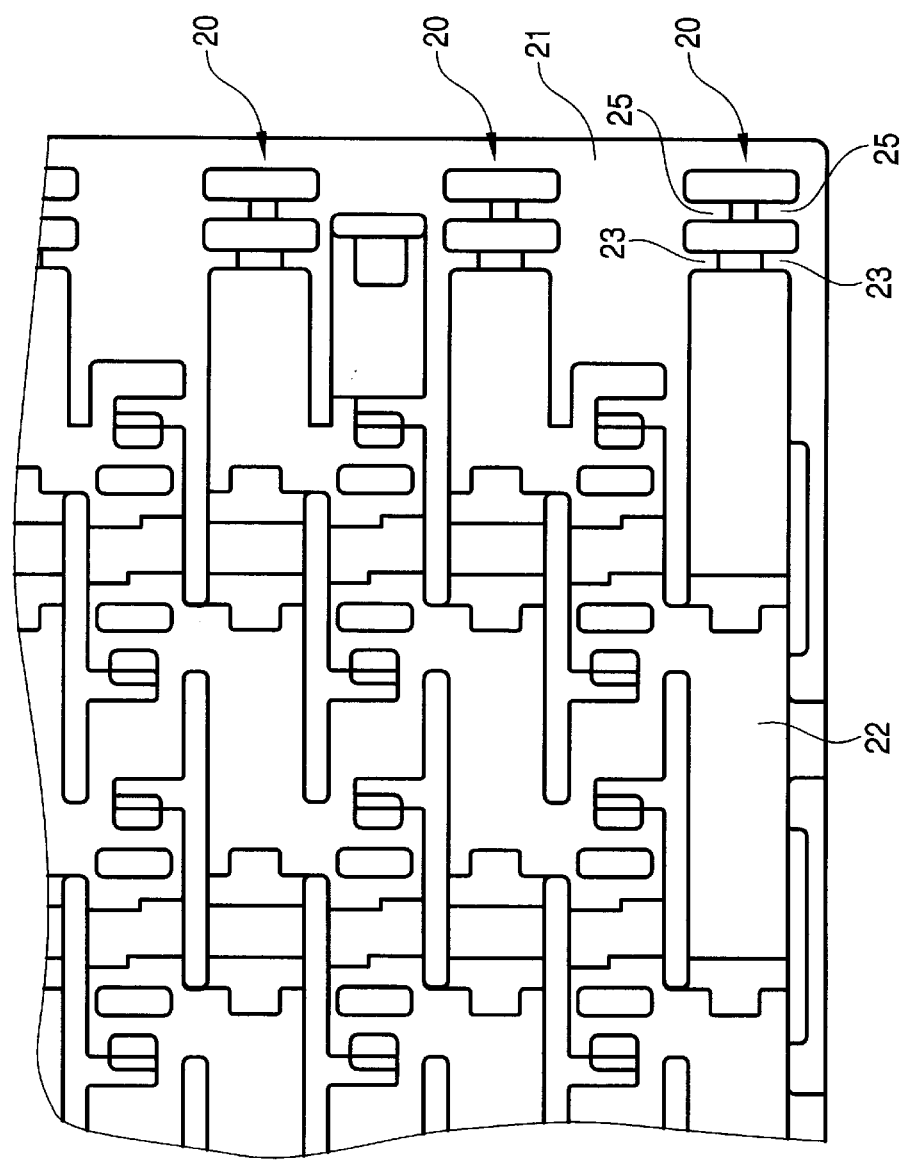
FIG. 3 is a plan view showing a corner portion of a wiring board incorporating a first embodiment of a wire holding structure of the present invention.

As shown in FIG. 3, the wire holding structures 20 of this embodiment are formed on a wiring board 21 made of a resin, and in this embodiment the holding structure for holding a wire end portion, which is formed at a corner portion of the wiring board 21, will be described.

Figure 4:
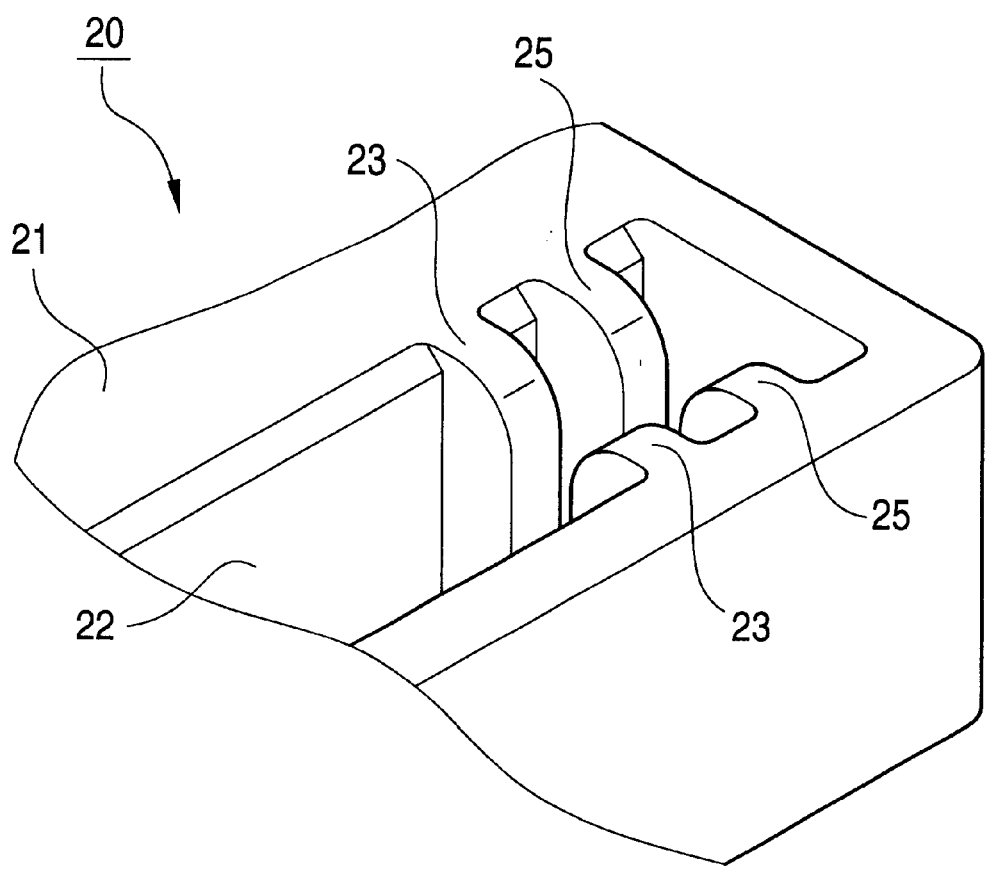
FIG. 4 is a perspective view showing an important portion of the wire holding structure of FIG. 3.

As shown in FIG. 4, the plurality of wire holding structures 20 are formed on the wiring board 21, and are arranged on straight lines, respectively, and each of these wire holding structures includes a wire receiving groove 22 for receiving a sheathed wire, and two pairs of wire gripping piece portions 23 and 25. More specifically, the first wire gripping piece portions 23 and 23 (forming a thick wire-gripping portion), defined respectively by a pair of opposed resin blades, and the second wire gripping piece portions 25 and 25 (which are disposed adjacent to the first wire gripping piece portions, and form a thin wire-gripping portion), defined respectively by a pair of opposed resin blades, are formed integrally on the wire receiving groove portion 22 by molding, the first and second wire gripping piece portions being formed in this order from the left (FIG. 4). A press-connecting terminal (not shown), made of metal, is mounted in a predetermined position in the wire receiving groove 22.

Figure 5:
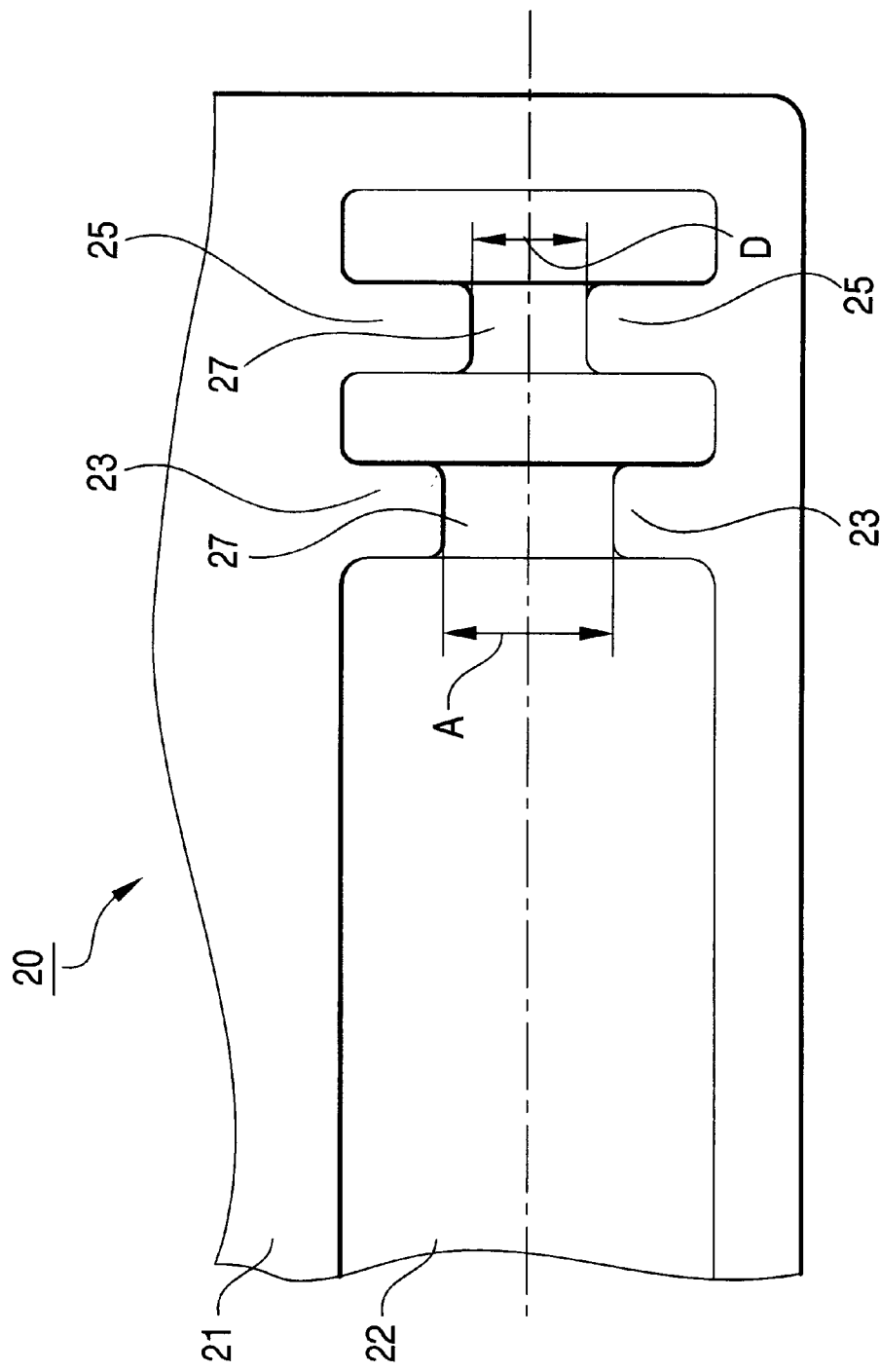
FIG. 5 is a plan view of the wire holding structure of FIG. 4.

As shown in FIG. 5, a centerline of a relatively wide opposition space (hereinafter referred to as "slot width") A between the first wire gripping piece portions 23 and 23 (for gripping a thick wire) and a centerline of a relatively narrow slot width D between the second wire gripping piece portions 25 and 25 (for gripping a thin wire) coincide with a centerline of the wire receiving groove 22.

The pitch of the first and second wire gripping piece portions 23 and 25 is suitably determined in accordance with the wire diameters, and generally this pitch is set to a value generally equal to the maximum diameter of the thick wire to be used.

A gripping piece portion-interconnecting portion 27, interconnecting the first wire gripping piece portions 23 and 23, is formed at a region disposed between and below the first wire gripping piece portions 23 and 23, and another gripping piece portion-interconnecting portion 27, interconnecting the second wire gripping piece portions 25 and 25, is formed at a region disposed between and below the second wire gripping piece portions 25 and 25. Thanks to the provision of these gripping piece portion-interconnecting portions 27, the bottom portion of the wire receiving groove 22, forming the region disposed between and below each pair of wire gripping piece portions, will not be warped upwardly into a convex shape when inserting the sheathed wire between the first wire gripping piece portions 23 and 23 and between the second wire gripping piece portions 25 and 25, and therefore the slot width A, D will not be expanded.

Figure 7:
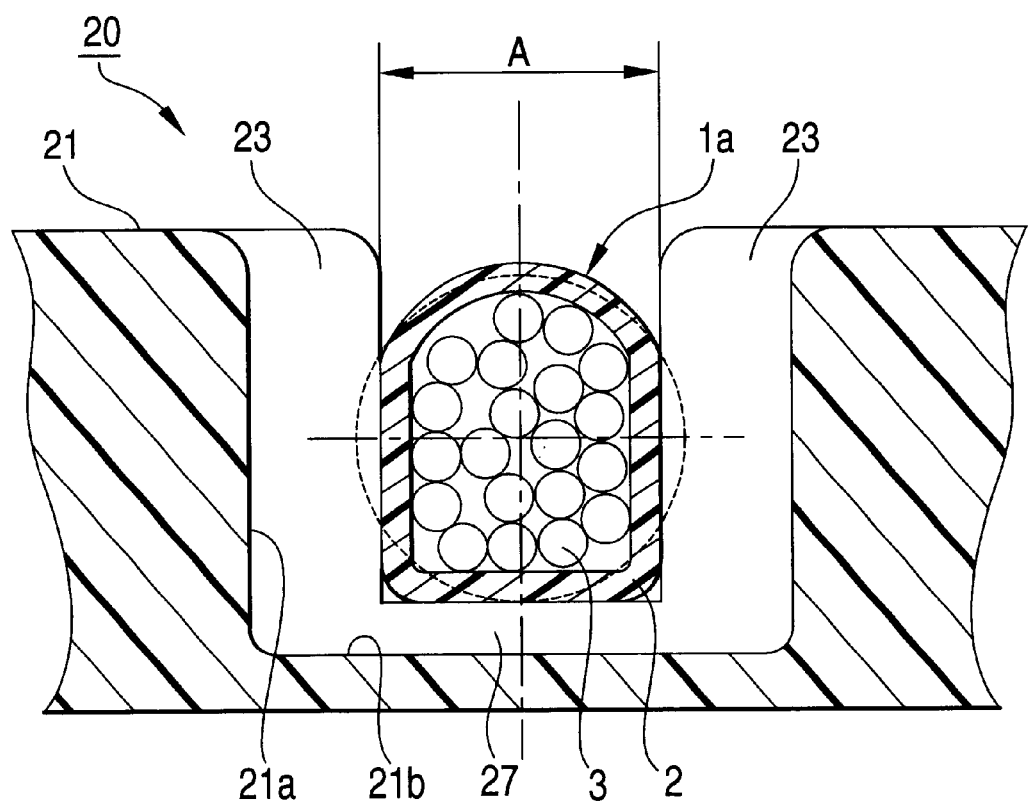
FIG. 7 is a cross-sectional view taken along the line VII—VII of FIG. 6.

The construction of the first wire gripping piece portions 23 will be described. As shown in FIG. 7, each first wire gripping piece portion 23 is in the form of a flat plate-like projected piece portion projecting from an inner surface 21a and an inner bottom surface 21b of the wiring board 21 toward the centerline.

As described above, the gripping piece portion-interconnecting portion 27, interconnecting the first wire gripping piece portions 23 and 23, is provided at the region disposed between and below these wire gripping piece portions. Therefore, the slot width A of a generally U-shape is defined by inner end surfaces of the first wire gripping piece portions 23 and an upper end surface of the gripping piece portion-interconnecting portion 27. The slot width A is smaller than the diameter of the thick wire to be gripped.

Figure 9:
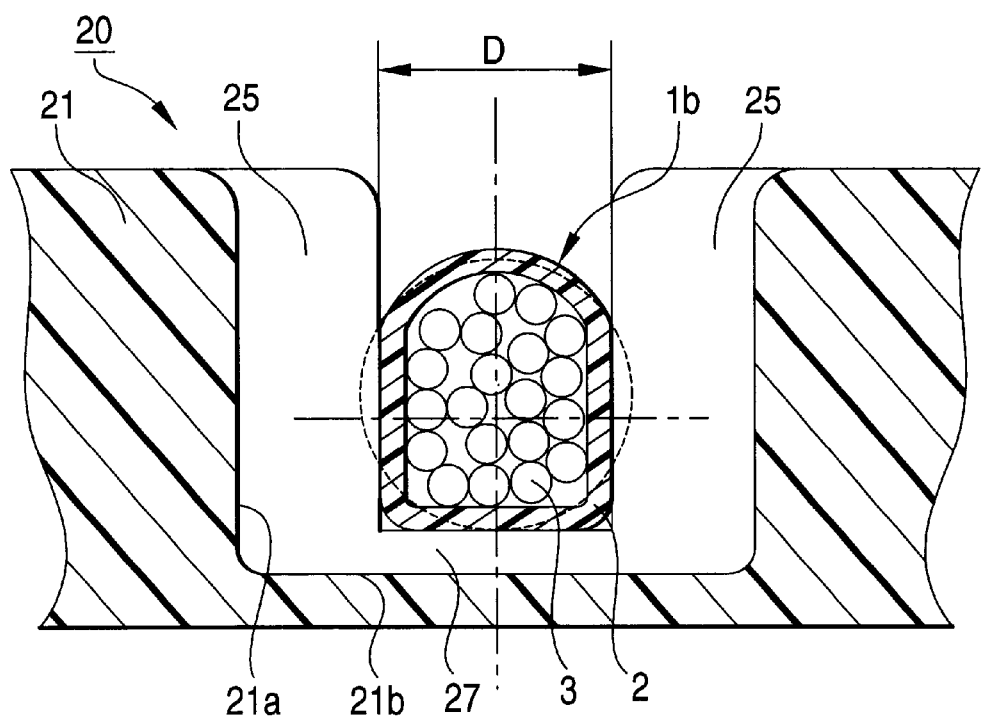
FIG. 9 is a cross-sectional view taken along the line IX—IX of FIG. 8.

The construction of the second wire gripping piece portions 25 will be described. As shown in FIG. 9, each second wire gripping piece portion 25 is in the form of a flat plate-like projected piece portion projecting from the inner surface 21a and the inner bottom surface 21b of the wiring board 21 toward the centerline.

As described above for the foregoing, the gripping piece portion-interconnecting portion 27, interconnecting the second wire gripping piece portions 25 and 25, is provided at the region disposed between and below these wire gripping piece portions. Therefore, the slot width D of a generally U-shape is defined by inner end surfaces of the second wire gripping piece portions 25 and an upper end surface of the gripping piece portion-interconnecting portion 27. The slot width D is smaller than the diameter of the thin wire to be gripped.

Figure 6:
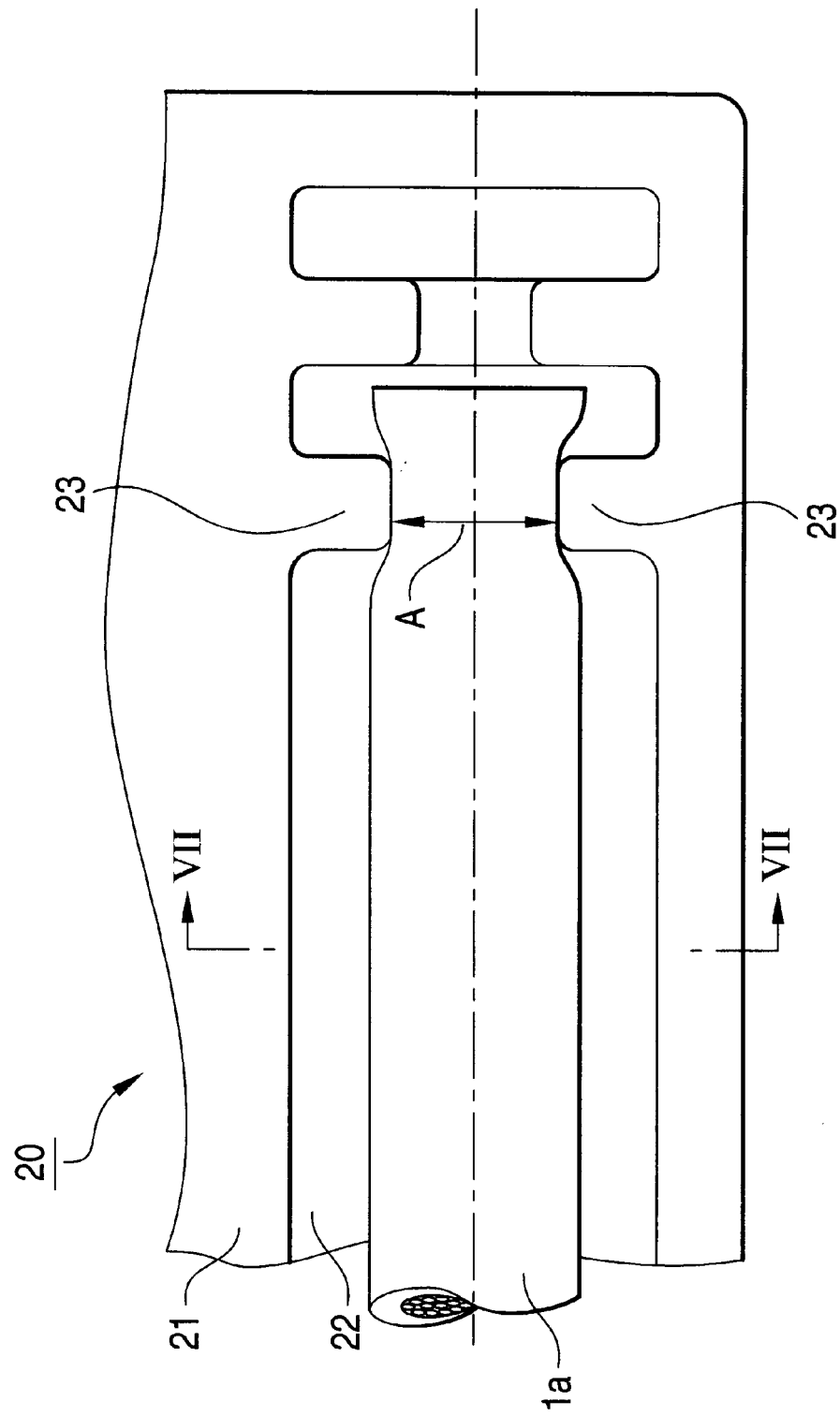
FIG. 6 is a plan view of the wire holding structure of FIG. 5, showing a thick wire in a held condition.

Next, the insertion of a thick wire 1a into the wire receiving groove 22 will be described. When an end portion of the thick wire 1a is inserted between the first wire gripping piece portions 23 and 23 as shown in FIGS. 6 and 7, this end portion is held in the slot width A between the first wire gripping piece portions 23 in such a manner that this end portion is compressively deformed from its initial wire diameter.

At this time, the first wire gripping piece portions 23 and 23 receive elastic forces of the sheathed wire 1a respectively in outward directions (perpendicular to the centerline in FIG. 6), so that the bottom portion of the wire receiving groove 22 tends to be deformed and warped upwardly. However, the first wire gripping piece portions 23 and 23 are interconnected by the gripping piece portion-interconnecting portion 27, and therefore the deformation or upward warp hardly occurs, and the force of gripping of the thick wire by the first wire gripping piece portions 23 is secured, thereby positively preventing the sheathed wire from being withdrawn in the axial direction and the upward direction.

Figure 8:
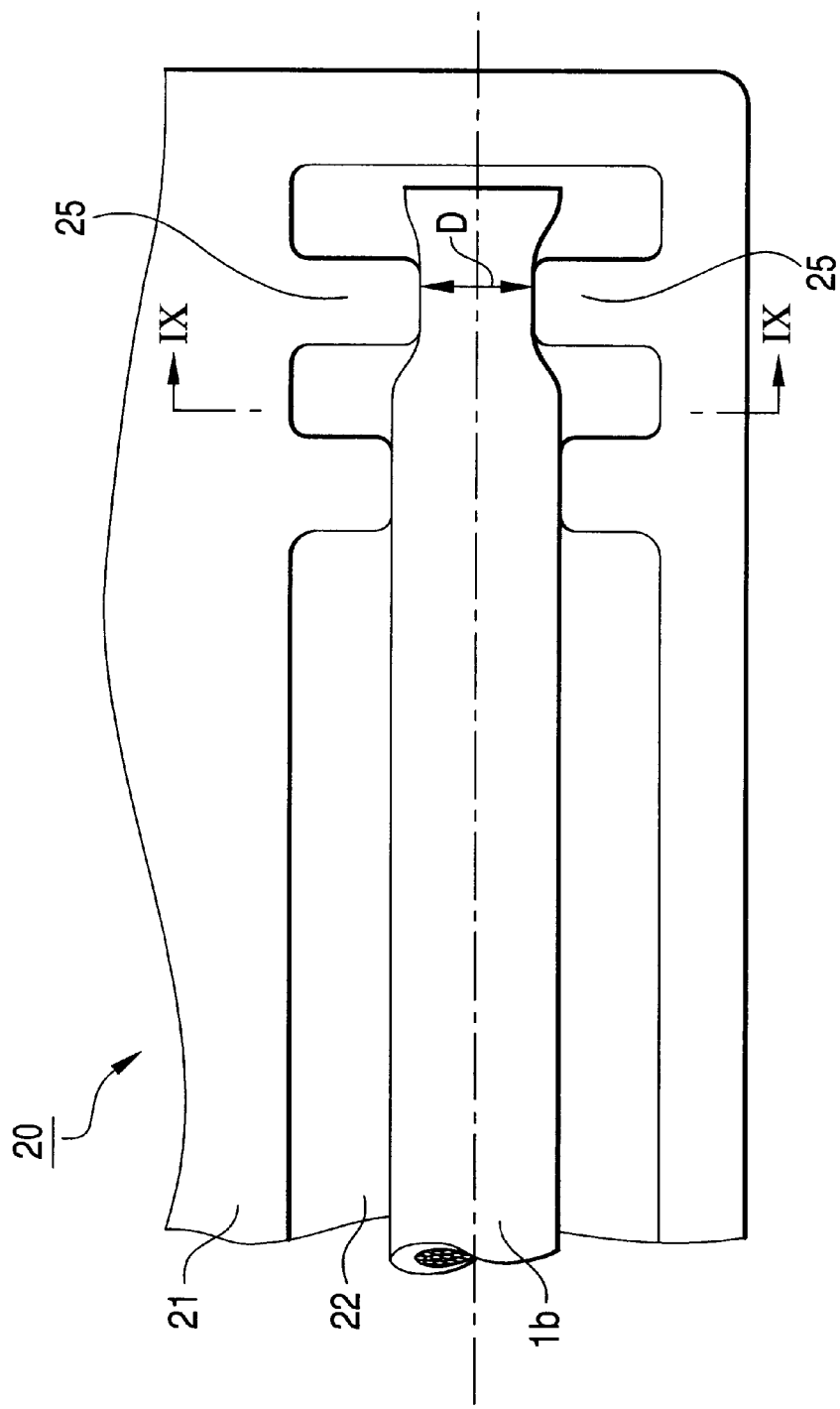
FIG. 8 is a plan view of the wire holding structure of FIG. 5, showing a thin wire in a held condition.

Next, the insertion of a thin wire 1b into the wire receiving groove 22 will be described. When an end portion of the thin wire 1b is inserted into the wire receiving portion 22, and is inserted between the second wire gripping piece portions 25 and 25 as shown in FIGS. 8 and 9, this end portion is held in the slot width D between the second wire gripping piece portions 25 in such a manner that this end portion is compressively deformed from its initial wire diameter.

At this time, the deformation or upward warp hardly occurs since the second wire gripping piece portions 25 and 25 are interconnected by the gripping piece portion-interconnecting portion 27 as described above, and the force of gripping of the thin wire by the second wire gripping piece portions 25 is secured, thereby positively preventing the sheathed wire from being withdrawn in the axial direction and the upward direction.

As described above, in the wire holding structure 20 of this embodiment, the gripping piece portion-interconnecting portion 27, interconnecting the first wire gripping piece portions 23 and 23, is provided at the region below these wire gripping piece portions, and also the gripping piece portion-interconnecting portion 27, interconnecting the second wire gripping piece portions 25 and 25, is provided at the region below these wire gripping piece portions. Therefore, when the sheathed wire is inserted between the first wire gripping piece portions 23 and 23 or between the second wire gripping piece portions 25 and 25, the bottom portion of the wire receiving groove 22 will not be warped upwardly into a convex shape, and therefore the slot width A or the slot width D will not be expanded. Therefore, the sheathed wire can be held rapidly and firmly, and the withdrawal of the sheathed wire in the axial direction and the upward direction can be positively prevented.

And besides, the first wire gripping piece portions 23 and 23 for the thick wire and the second wire gripping piece portions 25 and 25 (disposed adjacent to the first wire gripping piece portions) for the thin wire are provided on the same wire receiving groove 22, and therefore the first wire gripping piece portions 23 and the second wire gripping piece portions 25 can be selectively used in accordance with the outer diameter of the sheathed wire to be used. Therefore, in accordance with a selected one of various (at least two) kinds of wire diameters, the sheathed wire of the selected diameter can be positively held between the wire gripping piece portions 23 or 25.

2. Second Embodiment

Next, a second embodiment of a wire holding structure of the present invention will be described with reference to FIGS. 10 to 13.

Figure 10:
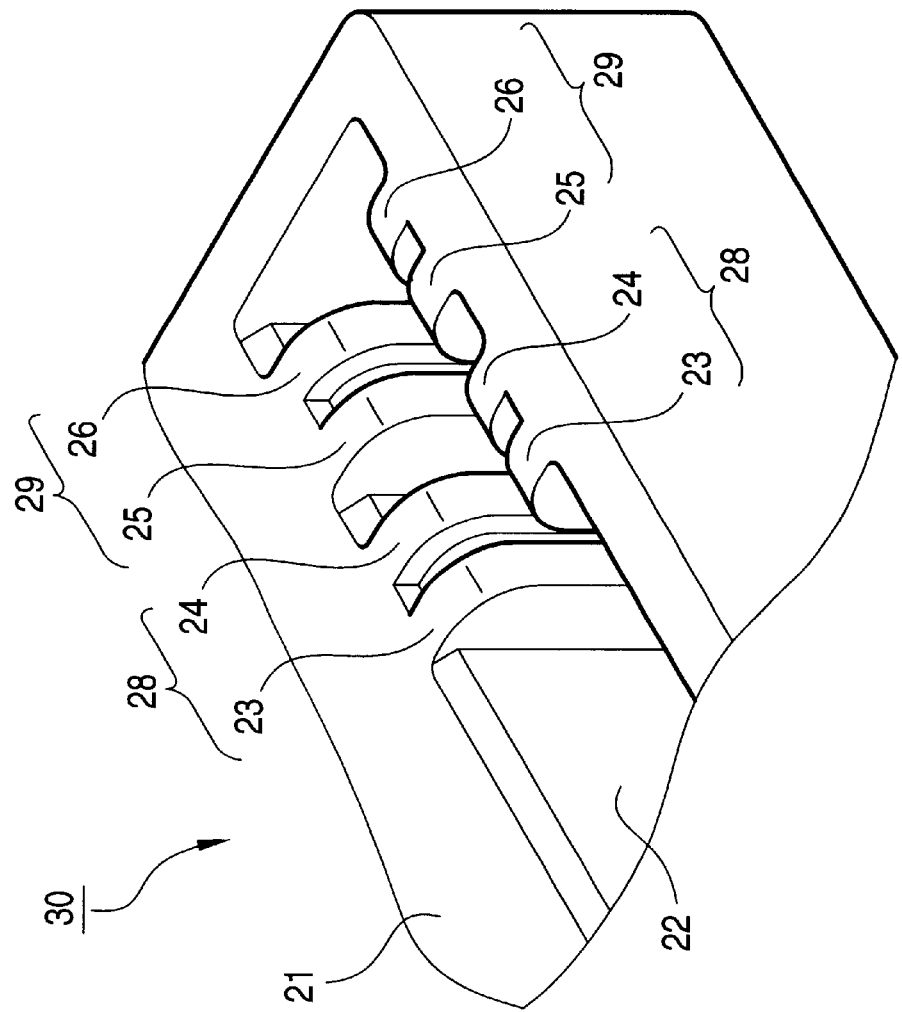
FIG. 10 is a perspective view showing a portion of a second embodiment of a wire holding structure of the present invention.

As shown in FIG. 10, a plurality of wire holding structures 30 of this embodiment are formed on a wiring board 21, and are arranged on straight lines, respectively, and each of these wire holding structures includes a wire receiving groove 22 for receiving a sheathed wire, and a plurality of pairs of wire gripping piece portions 23 to 26.

More specifically, a thick wire-gripping portion 28 for a thick wire, comprising two pairs of opposed first wire gripping piece portions 23 and 24, a thin wire-gripping portion 29 for a thin wire, which comprises two pairs of opposed second wire gripping piece portions 25 and 26, and is disposed adjacent to the thick wire-gripping portion 28, are formed integrally on the wire receiving groove portion 22 by molding, the first and second wire gripping piece portions being formed in this order from the left (FIG. 10). A press-connecting terminal (not shown), made of metal, is mounted in a predetermined position in the wire receiving groove 22.

Figure 11:
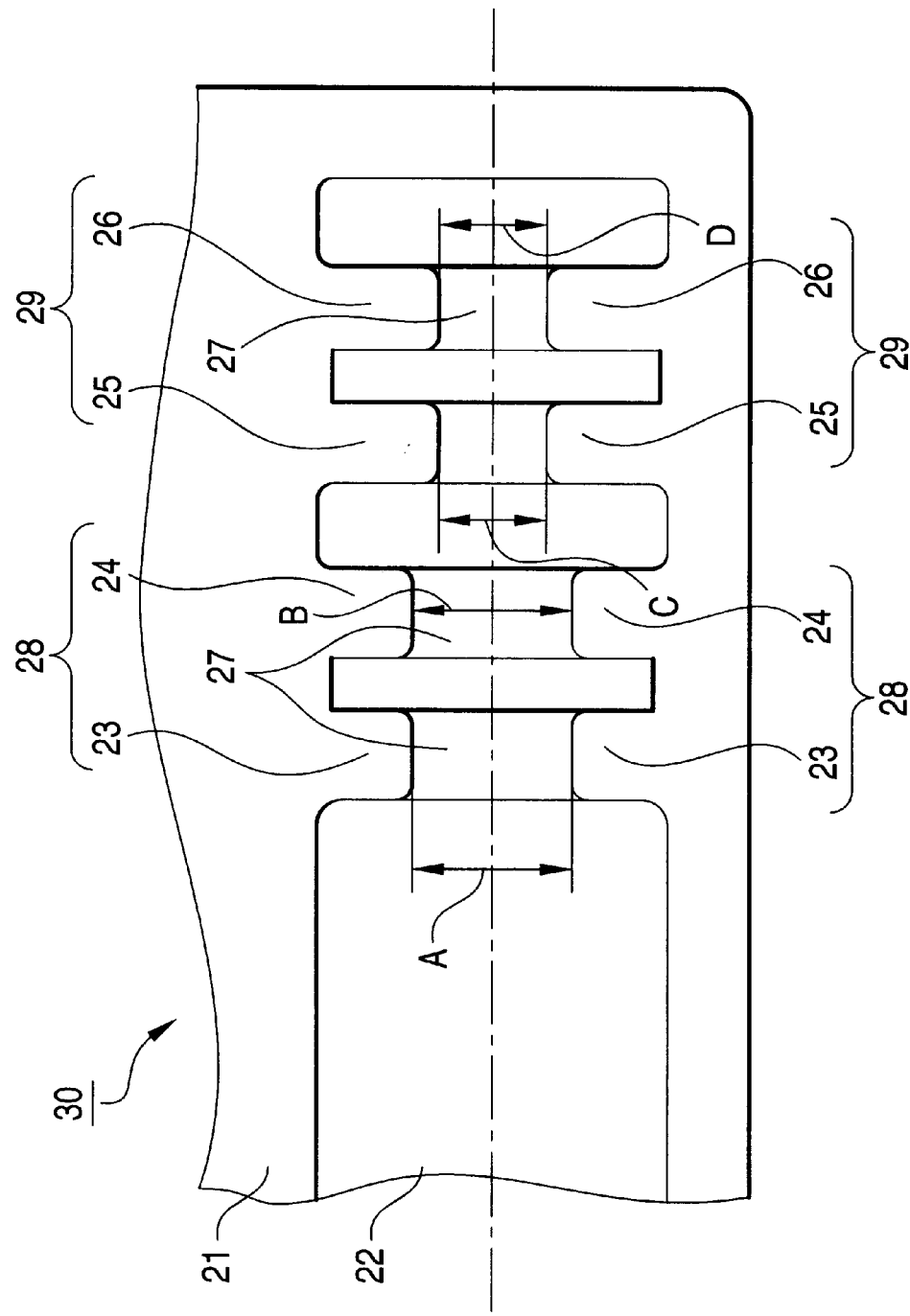
FIG. 11 is a plan view of the wiring holding structure of FIG. 10.

As shown in FIG. 11, a centerline of a relatively wide opposition space (hereinafter referred to as "slot width") A between the first wire gripping piece portions 23 and 23 (for gripping a thick wire) and a centerline of a relatively-wide slot width B between the first wire gripping piece portions 24 and 24 (for gripping the thick wire) coincide with a centerline of the wire receiving groove 22. The slot width A and the slot width B are equal to each other, and are smaller than the diameter of the thick wire to be gripped.

A gripping piece portion-interconnecting portion 27, interconnecting each pair of first wire gripping piece portions 23, 24, is formed at a region disposed between and below each pair of first wire gripping piece portions 23, 24. The slot width A, B of a generally U-shape is defined by inner end surfaces of each pair of first wire gripping piece portions 23, 24 and an upper end surface of the corresponding gripping piece portion-interconnecting portion 27 (see FIG. 7). Thanks to the provision of these gripping piece portion-interconnecting portions 27, the bottom portion of the wire receiving groove 22, forming the region disposed between and below each pair of first wire gripping piece portions 23, 24, will not be warped upwardly into a convex shape when inserting the sheathed wire between the first wire gripping piece portions 23 and 23 and between the first wire gripping piece portions 24 and 24, and therefore the slot widths A and B will not be expanded.

The two pairs of second wire gripping piece portions 25 and 26 (forming the thin wire-gripping portion 29), having relatively narrow slot widths C and D, respectively, are formed adjacent to the thick wire-gripping portion 28. A centerline between the second wire gripping piece portions 25 and 25 and a centerline between the second wire gripping piece portions 26 and 26 coincide with the centerline of the wire receiving portion 22. The slot width C and the slot width D are equal to each other, and are smaller than the diameter of the thin wire to be gripped.

A gripping piece portion-interconnecting portion 27, as described above, is formed at a region disposed between and below the second wire gripping piece portions 26 and 26. A slot width D of a generally U-shape is defined by inner end surfaces of the wire gripping piece portions 26 and the upper end surface of the gripping piece portion-interconnecting portion 27 (see FIG. 9). Therefore, as described above, the bottom portion of the wire receiving groove 22, forming the region disposed between and below the second wire gripping piece portions 26 and 26, will not be warped upwardly into a convex shape when inserting the sheathed wire between these second wire gripping piece portions, and therefore the slot width D will not be expanded.

Any gripping piece portion-interconnecting portion 27, as described above, is not provided for the second wire gripping piece portions 25, and a slot width C of a generally U-shape is defined by inner end surfaces of the second wire gripping piece portions 25 and 25 and an inner bottom surface 21b (see FIG. 9). Namely, the slot widths C and D of the thin wire-gripping portion 29 are narrow, and a thin wire-inserting force is small, and the bottom portion of the wire receiving groove 22 is hardly warped upwardly. Therefore, a sufficient wire holding force can be obtained by providing the interconnecting portion on at least one of the pairs of wire gripping piece portions (26).

The pitch of the wire gripping piece portions 23 to 26 is suitably determined in accordance with the wire diameters, and generally this pitch is set to a value generally equal to the maximum diameter of the thick wire to be used.

Figure 12:
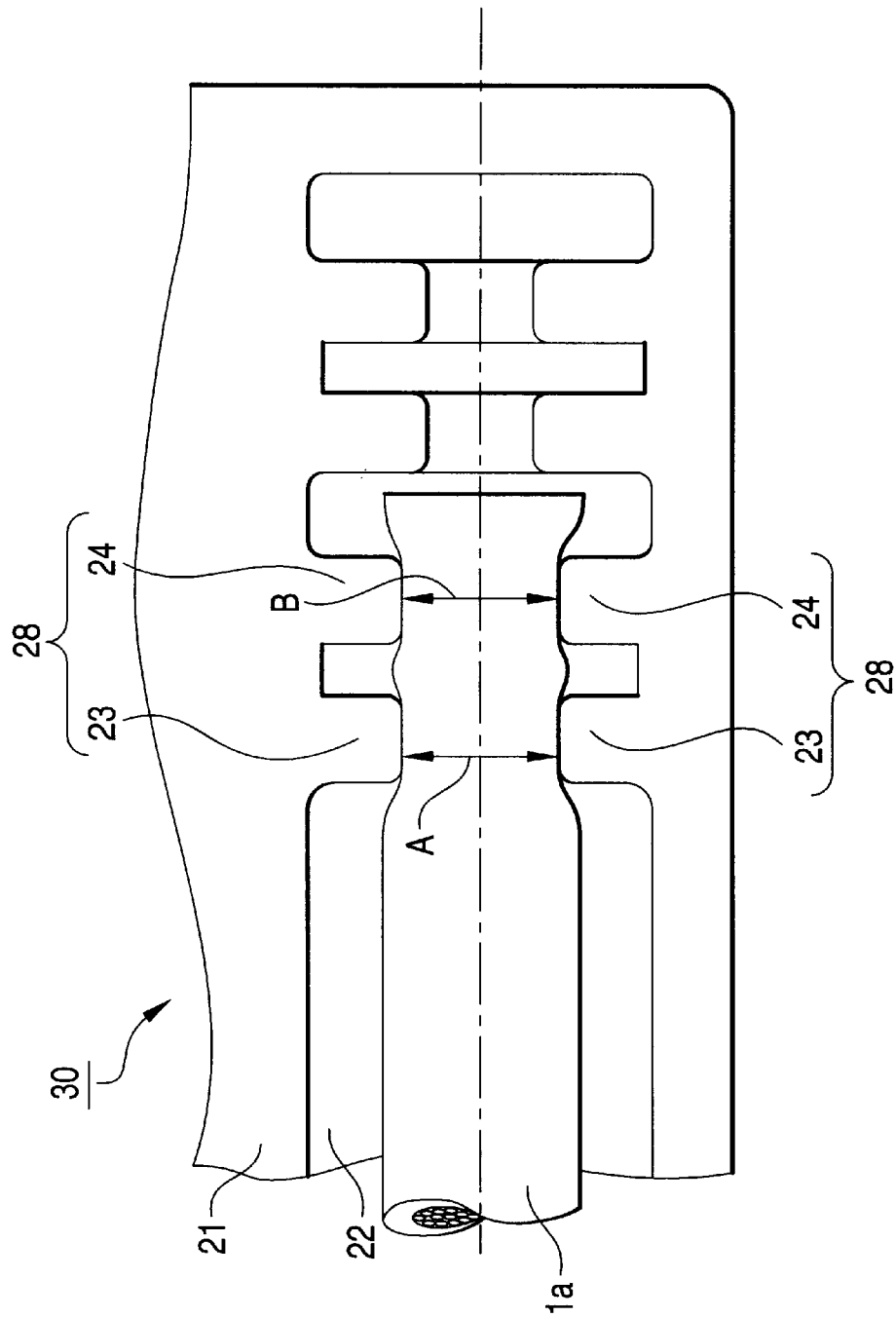
FIG. 12 is a plan view of the wire holding structure, showing a thick wire in a held condition.

Next, the insertion of a thick wire 1a into the wire receiving groove 22 will be described. When an end portion of the thick wire 1a is inserted between the first wire gripping piece portions 23 and between the first wire gripping piece portions 24 as shown in FIG. 12, this end portion is held in the slot widths A and B of the first wire gripping piece portions 23 and 24 in such a manner that this end portion is compressively deformed from its initial wire diameter. At this time, the first wire gripping piece portions 23 and 24 receive elastic forces of the sheathed wire 1a respectively in outward directions (perpendicular to the centerline in FIG. 12), so that the bottom portion of the wire receiving groove 22 tends to be deformed and warped upwardly.

However, the first wire gripping piece portions 23 and 23, as well as the first wire gripping piece portions 24 and 24, are interconnected by the gripping piece portion-interconnecting portion 27 (see FIG. 11), and therefore the deformation or upward warp hardly occurs, and the force of gripping of the thick wire by the first wire gripping piece portions 23 and 24 is secured, thereby positively preventing the sheathed wire from being withdrawn in the axial direction and the upward direction.

Figure 13:
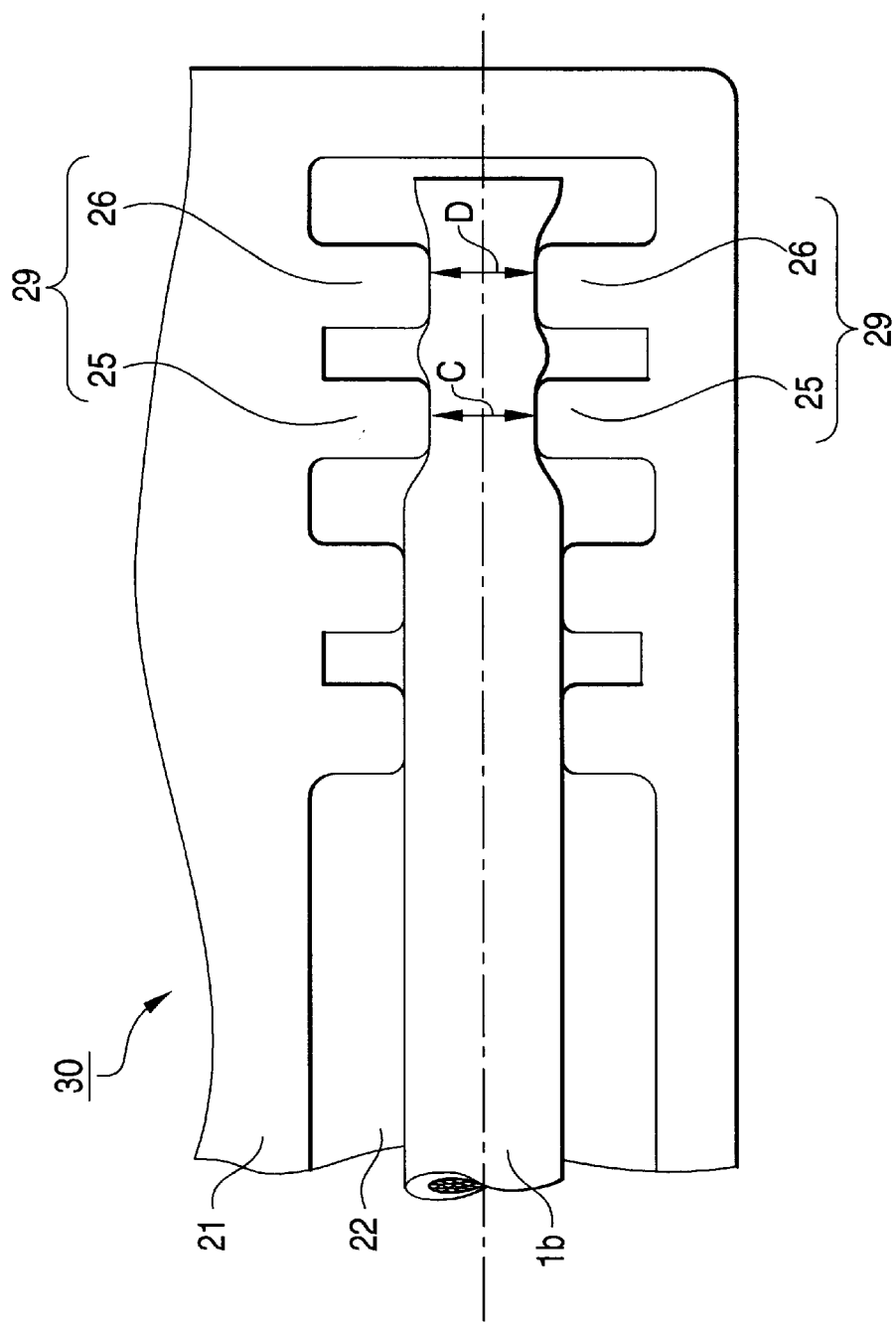
FIG. 13 is a plan view of the wiring holding structure, showing a thin wire in a held condition.

Next, the insertion of a thin wire 1b into the wire receiving groove 22 will be described. When an end portion of the thin wire 1b is inserted into the wire receiving portion 22, and is inserted between the second wire gripping piece portions 25 and between the second wire gripping piece portions 26 as shown in FIG. 13, this end portion is held in the slot widths C and D of the second wire gripping piece portions 25 and 26 in such a manner that this end portion is compressively deformed from its initial wire diameter. Therefore, the force of gripping of the thin wire 1b is secured, thereby positively preventing the thin wire 1b from being withdrawn in the axial direction and the upward direction.

As described above, the thick wire-gripping portion 28 for the thick wire, comprising the first wire gripping piece portions 23 and 24, and the thin wire-gripping portion 29 for the thin wire, which comprises the second wire gripping piece portions 25 and 26, and is disposed adjacent to the thick wire-gripping portion 28, are provided on the same wire receiving groove 22, and therefore the thick wire-gripping portion 28 and the thin wire-gripping a portion 29 can be selectively used in accordance with the outer diameter of the sheathed wire to be used. Therefore, in accordance with a selected one of various (at least two) kinds of wire diameters, the sheathed wire of the selected diameter can be positively held by the wire gripping portion 28 or 29.

In the wire holding structures 20 and 30 of the above embodiments, although the two wire gripping portions, that is, the thick wire-gripping portion and the thin wire-gripping portion, are arranged adjacent to each other along the wire receiving groove, another wire gripping portion can be added such that the three wire gripping portions are arranged serially.

Although the structures for holding the end portion of the sheathed wire have been described, the present invention can be applied to a wire gripping portion which is provided at a central portion of the wiring board so as to hold an intermediate portion of the sheathed wire, and with this construction the sheathed wire can be more firmly held on the wiring board.

As described above, in the first and second embodiments of the wire holding structures of the present invention, the gripping piece portion-interconnecting portion, interconnecting the wire gripping piece portions, is provided at the region below these wire gripping piece portions. The wire gripping piece portions include the first wire gripping piece portions for a thick wire, and the second wire gripping piece portions for a thin wire, which are disposed adjacent to the first wire gripping piece portions, and the centerline between the first gripping piece portions and the centerline between the second gripping piece portions coincide with each other.

Therefore, when the sheathed wire is inserted between the first wire gripping piece portions or between the second wire gripping piece portions, the bottom portion of the wire receiving groove, forming the region disposed between and below the wire gripping piece portions, will not be warped upwardly, and therefore the opposition space will not be expanded, and the wire can be positively held at least between the first or second wire gripping piece portions. Therefore, the wires, having the relatively wide range of wire diameters, can be held rapidly and firmly, and the withdrawal of the wire in the axial direction and the upward direction can be positively prevented.

In accordance with the outer diameter of the sheathed wire, the wire gripping piece portions are divided into the first wire gripping piece portions for the thick wire and the second wire gripping piece portions for the thin wire, and the first and second wire gripping piece portions are arranged serially on the same wire receiving groove. Therefore, at least two wire diameters can be used, and a selected one of the wires of different diameters can be positively held between the corresponding wire gripping piece portions.

Therefore, a selected one of the wires of different diameters can be more positively held between the corresponding wire gripping piece portions, and the wiring board and a connector, having an excellent versatility, can be obtained.

3. Third Embodiment

A third embodiment of a wire holding structure of the present invention will be described in detail with reference to FIGS. 14 to 20.

For better understanding, the third embodiment will be described as a modification of the second embodiment already described.

Figure 14:
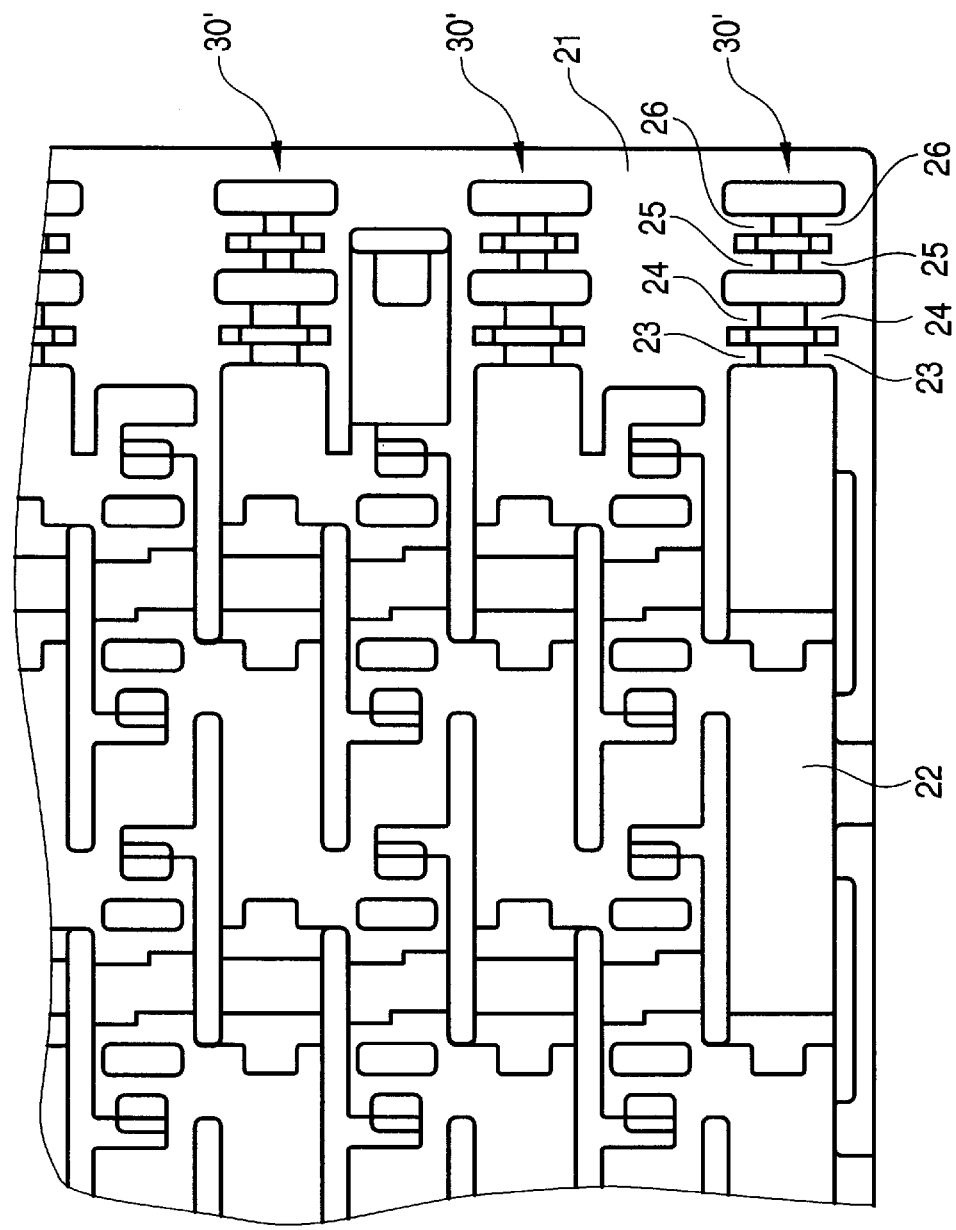
FIG. 14 is a plan view showing a corner portion of a wiring board incorporating a third embodiment of a wire holding structure of the present invention.

As shown in FIG. 14, the wire holding structures 30' of this embodiment are formed at an end portion of a wiring board 21 made of a resin, and in this embodiment the holding structure for holding a wire end portion, which is formed at a corner portion of the wiring board 21, will be described.

Figure 15:
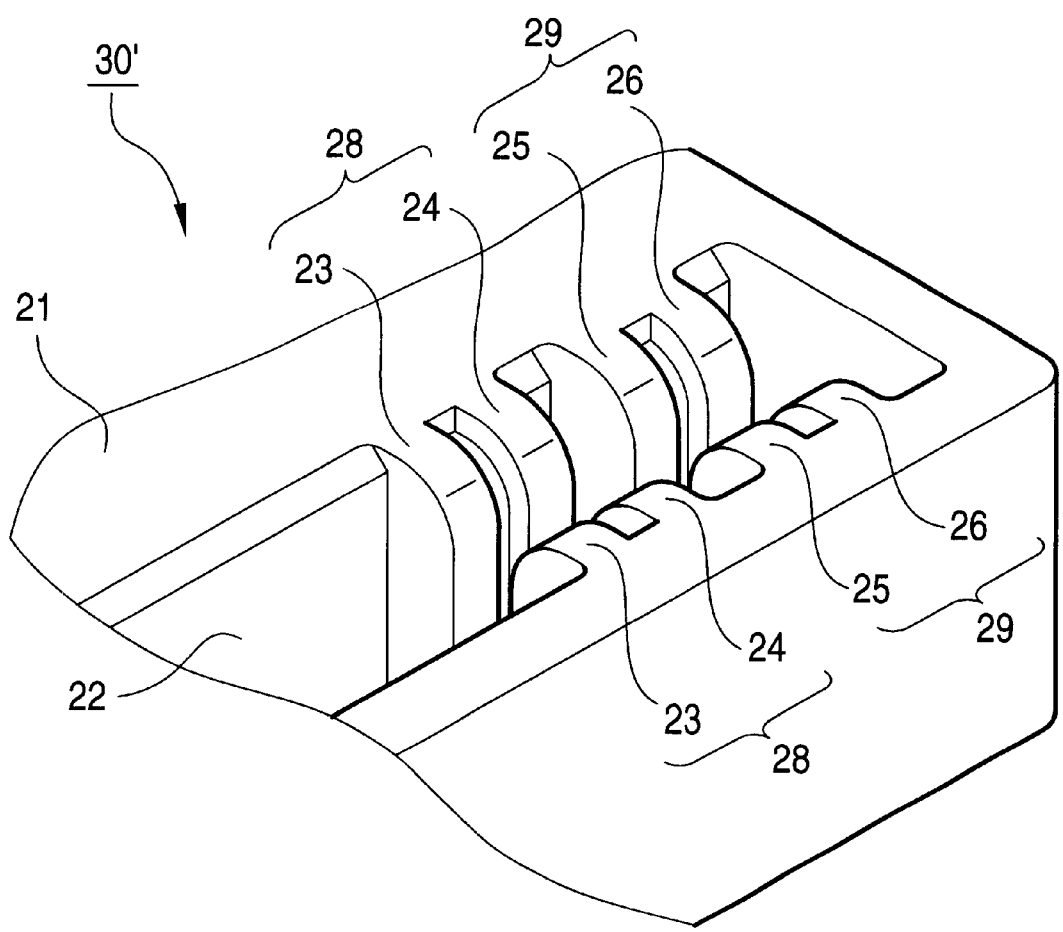
FIG. 15 is a perspective view showing an important portion of the wire holding structure of FIG. 14.

As shown in FIG. 15, a plurality of wire holding structures 30' are formed on the wiring board 21, and are arranged on straight lines, respectively, and each of these wire holding structures includes a wire receiving groove 22 for receiving a sheathed wire, and a plurality of pairs of wire gripping piece portions 23 to 26.

More specifically, a thick wire-gripping portion 28 for a thick wire, comprising two pairs of first wire gripping piece portions (opposed resin blades) 23 and 24, is formed integrally on the wire receiving groove portion 22 by molding, the first and second wire gripping piece portions being formed in this order from the left (FIG. 15).

Similarly, a thin wire-gripping portion 29 for a thin wire, which comprises two pairs of second wire gripping piece portions 25 and 26, and is provided at the end portion of the wiring board 21 disposed adjacent to the thick wire-gripping portion 28, are formed on the wire receiving groove portion 22. A press-connecting terminal (not shown), made of metal, is mounted in a predetermined position in the wire receiving groove 22.

Figure 16:
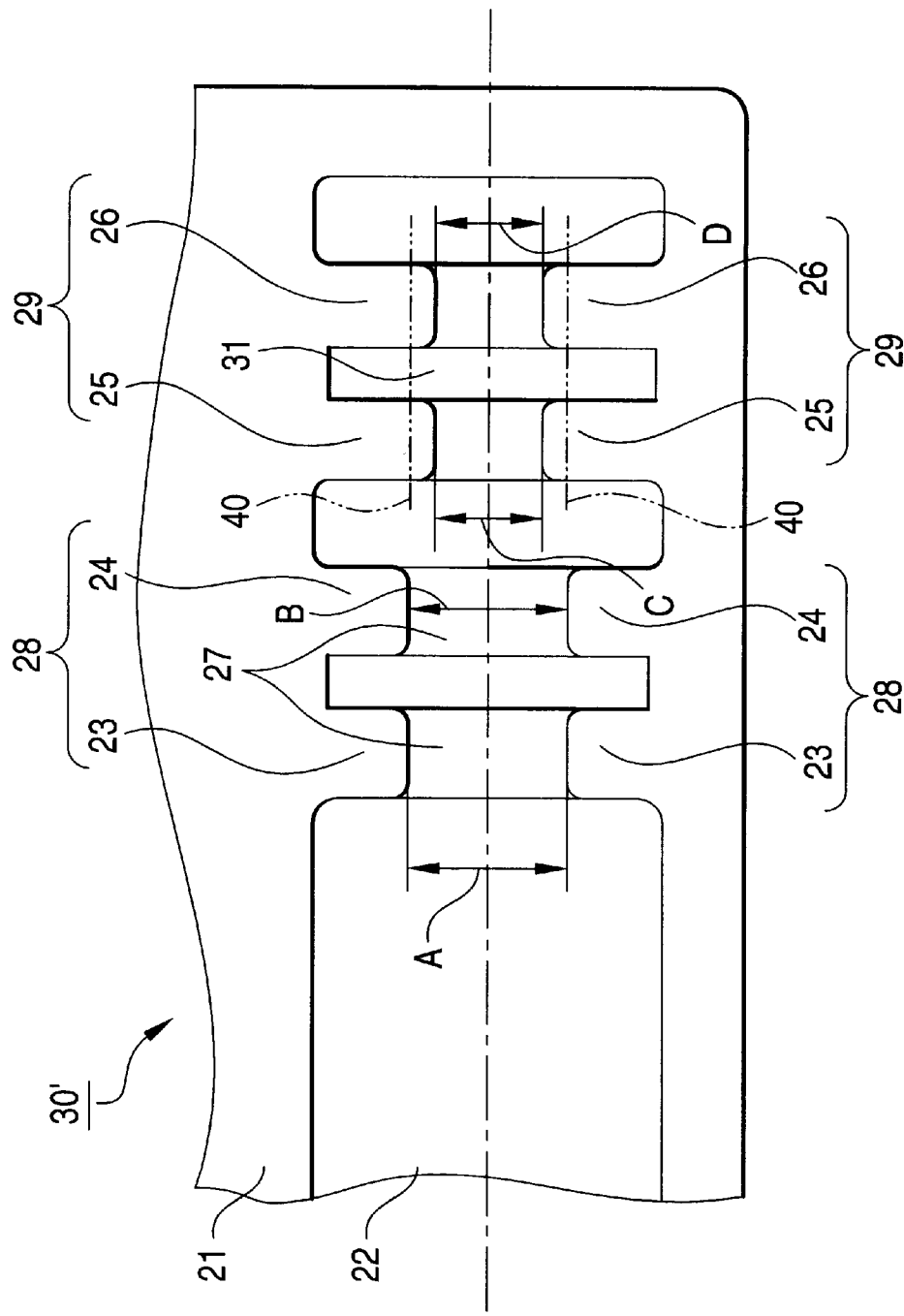
FIG. 16 is a plan view of the wire holding structure of FIG. 15.

As shown in FIG. 16, a centerline of a relatively wide opposition space (hereinafter referred to as "slot width") A between the first wire gripping piece portions 23 and 23 (for gripping a thick wire) and a centerline of a relatively-wide slot width B between the first wire gripping piece portions 24 and 24 (for gripping the thick wire) coincide with a centerline of the wire receiving groove 22. The slot width A between the wire gripping piece portions 23 and 23 and the slot width B between the wire gripping piece portions 24 and 24 are equal to each other, and are smaller than the diameter of the thick wire to be gripped.

A gripping piece portion-interconnecting portion 27, interconnecting each pair of first wire gripping piece portions 23, 24, is formed at a region disposed between and below each pair of first wire gripping piece portions 23, 24. Thanks to the provision of these gripping piece portion-interconnecting portions 27, the bottom portion of the wire receiving groove 22, forming the region disposed between and below each pair of first wire gripping piece portions 23, 24, will not be warped upwardly into a convex shape when inserting the sheathed wire between the first wire gripping piece portions 23 and 23 and between the first wire gripping piece portions 24 and 24, and therefore the slot widths A and B will not be expanded.

Figure 18:
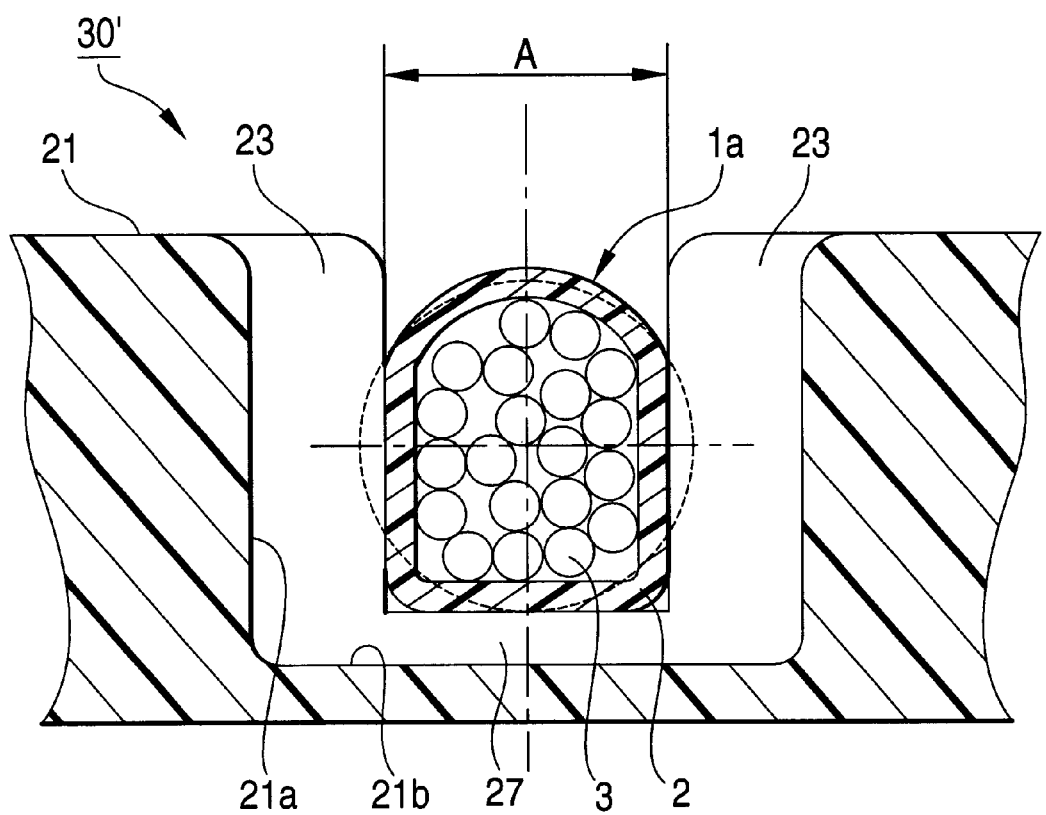
FIG. 18 is a cross-sectional view taken along the line XVIII—XVIII of FIG. 17.

The construction of the first wire gripping piece portions 23 will be described. As shown in FIG. 18, each first wire gripping piece portion 23 is in the form of a flat plate-like projected piece portion projecting from an inner surface 21a and an inner bottom surface 21b of the wiring board 21 toward the centerline.

As described above, the gripping piece portion-interconnecting portion 27, interconnecting the first wire gripping piece portions 23 and 23, is provided at the region disposed between and below these wire gripping piece portions.

Therefore, the slot width A of a generally U-shape is defined by inner end surfaces of the first wire gripping piece portions 23 and an upper end surface of the gripping piece portion-interconnecting portion 27. The construction of the first wire gripping piece portions 23 has thus been described, and the other first wire gripping piece portions 24 have the same construction as that of the first wire gripping piece portions 23.

As shown in FIG. 16, the two pairs of second wire gripping piece portions 25 and 26 (forming the thin wire-gripping portion 29), having relatively narrow slot widths C and D, respectively, are formed adjacent to the thick wire-gripping portion 28. A centerline of the slot width C and a centerline of the slot width D coincide with the centerline of the thick wire-gripping portion 28.

An opening 31 is formed through that portion of the bottom portion of the wire receiving groove 22 disposed below the second wire gripping piece portions 25 and 26. When inner end portions of the second wire gripping piece portions 25 and 26 are cut off (at cutting portions indicated respectively by dots-and-dash lines shown in FIG. 16) so that their slot widths can correspond to the slot widths A and B of the first wire gripping piece portions 23 and 24 of the thick wire-gripping portion 28, such cutting pieces are discharged through this opening 31 to the lower side.

The slot widths C and D are smaller than the diameter of the thin wire to be gripped. The pitch of the wire gripping piece portions 23 to 26 is suitably determined in accordance with the wire diameters, and generally this pitch is set to a value generally equal to the maximum diameter of the thick wire to be used.

Figure 20:
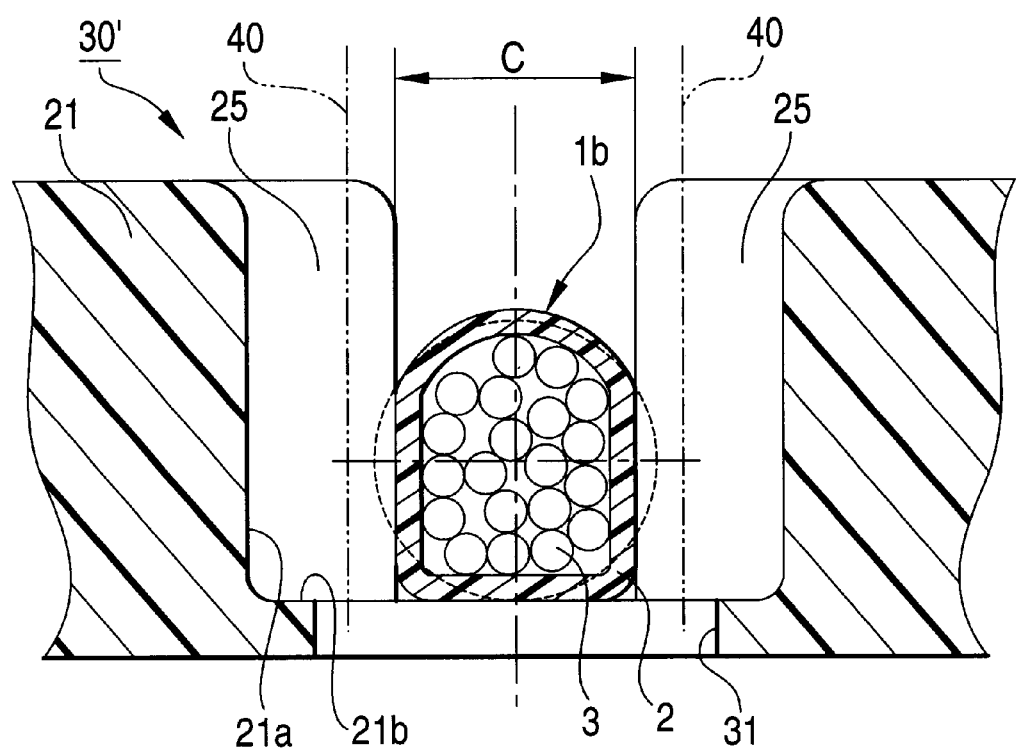
FIG. 20 is a cross-sectional view taken along the line XX—XX of FIG. 19.

The construction of the second wire gripping piece portions 25 will be described. As shown in FIG. 20, each second wire gripping piece portion 25 is in the form of a flat plate-like projected piece portion projecting from the inner surface 21a and the inner bottom surface 21b of the wiring board 21 toward the centerline.

However, any gripping piece portion-interconnecting portion 27 (see FIG. 18) (as described above for the thick wire-gripping portion 28), interconnecting the wire gripping piece portions, is not provided, and the opening 31 is formed in the inner bottom surface 21b. The cutting pieces, cut at the cutting portions 40, drop through this opening 31 downward from the wiring board 21.

The slot widths C and D for the thin wire is narrower than those of the thick wire-gripping portion 28, and the force for inserting the thin wire 1b is small, and therefore the bottom portion of the wire receiving groove 22 is hardly warped upwardly. Therefore, a sufficient wire holding force can be obtained without providing any gripping piece portion-interconnecting portion 27 as described for the thick wire-gripping portion 28.

Next, the insertion of a thick wire 1a into the wire receiving groove 22 will be described. When inserting the thick wire 1a as shown in FIGS. 16 and 20, the inner end portions of the second wire gripping piece portions 25 and 26 are cut off at the cutting portions 40 by an automatic cutter or the like so that the opposition spaces of the second wire gripping piece portions 25 and 26 can correspond to the opposition spaces A and B of the thick wire-gripping portion 28.

As a result of this cutting operation, the opposition spaces C and D of the second wire gripping piece portions 25 and 26 are increased to become substantially equal to the opposition spaces A and B of the thick wire-gripping portion 28, and therefore the thick wire 1a can be inserted. Cutting pieces, produced in this cutting operation, are discharged through the opening 31 downwardly from the wiring board 21, and therefore will not remain in the wire receiving portion 22.

Figure 17:
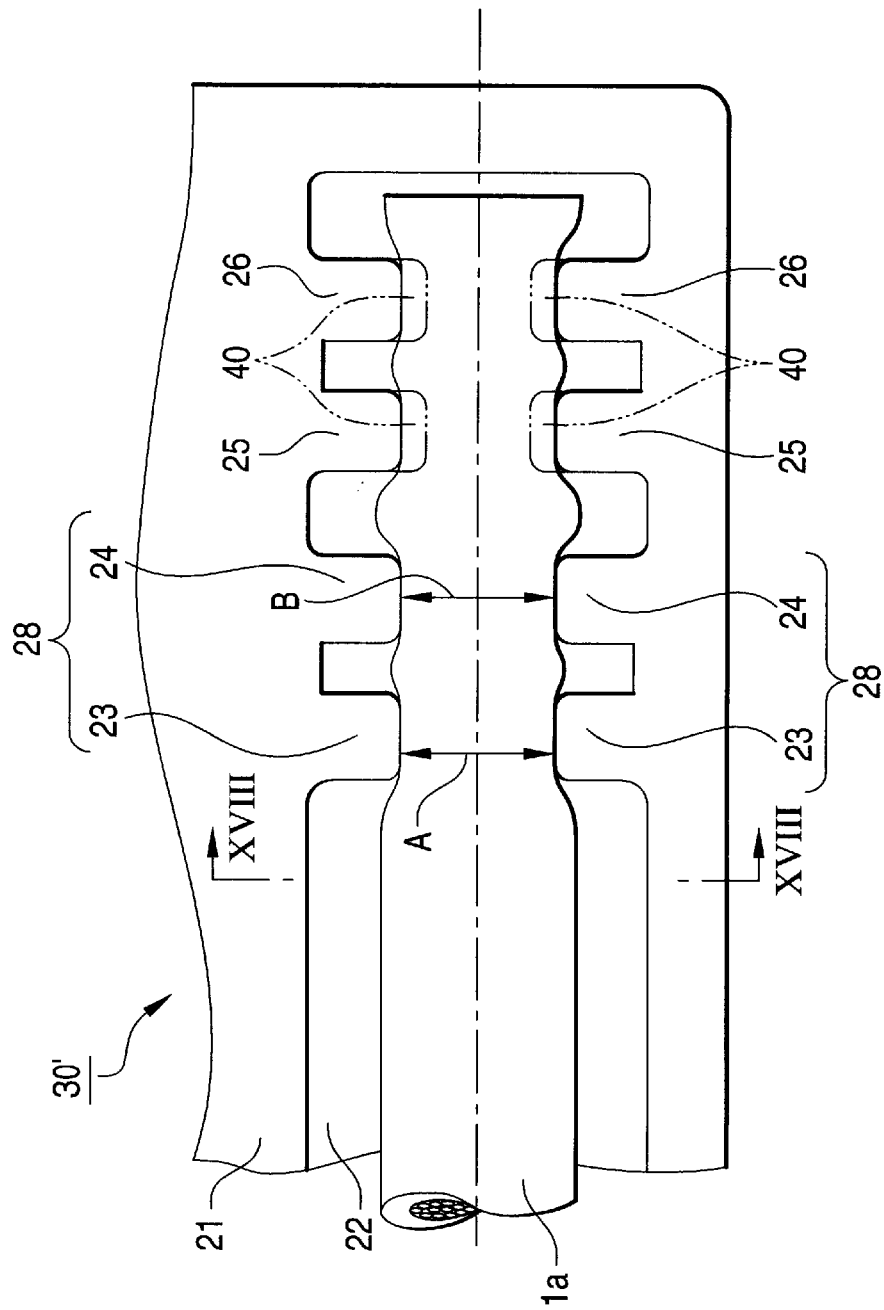
FIG. 17 is a plan view of the wire holding structure of FIG. 16, showing a thick wire in a held condition.

Next, the thick wire 1a is inserted in such a manner that the end portion of this thick wire 1a passes between each pair of second wire gripping piece portions 25, 26 of the thin wire-gripping portion 29 disposed at the end portion of the wire receiving groove 22, as shown in FIGS. 17 and 18. As a result, the thick wire 1a is firmly gripped by four portions, that is, the first wire gripping piece portions 23 and 24 of the thick wire-gripping portion 28 and the second wire gripping piece portions 25 and 26 of the thin wire-gripping portion 29, linearly on the same centerline in such a manner that this thick wire 1a is compressively deformed from its initial wire diameter.

At this time, the first wire gripping piece portions 23 and 24 receive elastic forces of the thick wire 1a respectively in outward directions (perpendicular to the centerline in FIG. 17), so that the bottom portion of the wire receiving groove 22 tends to be deformed and warped upwardly. However, the first wire gripping piece portions 23 and 23, as well as the first wire gripping piece portions 24 and 24, are interconnected by the gripping piece portion-interconnecting portion 27, and therefore the deformation or upward warp hardly occurs.

Therefore, the thick wire 1a can be rapidly and firmly gripped by the first wire gripping piece portions 23 and 24 of the thick wire-gripping portion 28 and the second wire gripping piece portions 25 and 26 of the thin wire-gripping portion 29, and this wire is prevented from being withdrawn in the longitudinal direction of the wire receiving groove and the upward direction.

Figure 19:
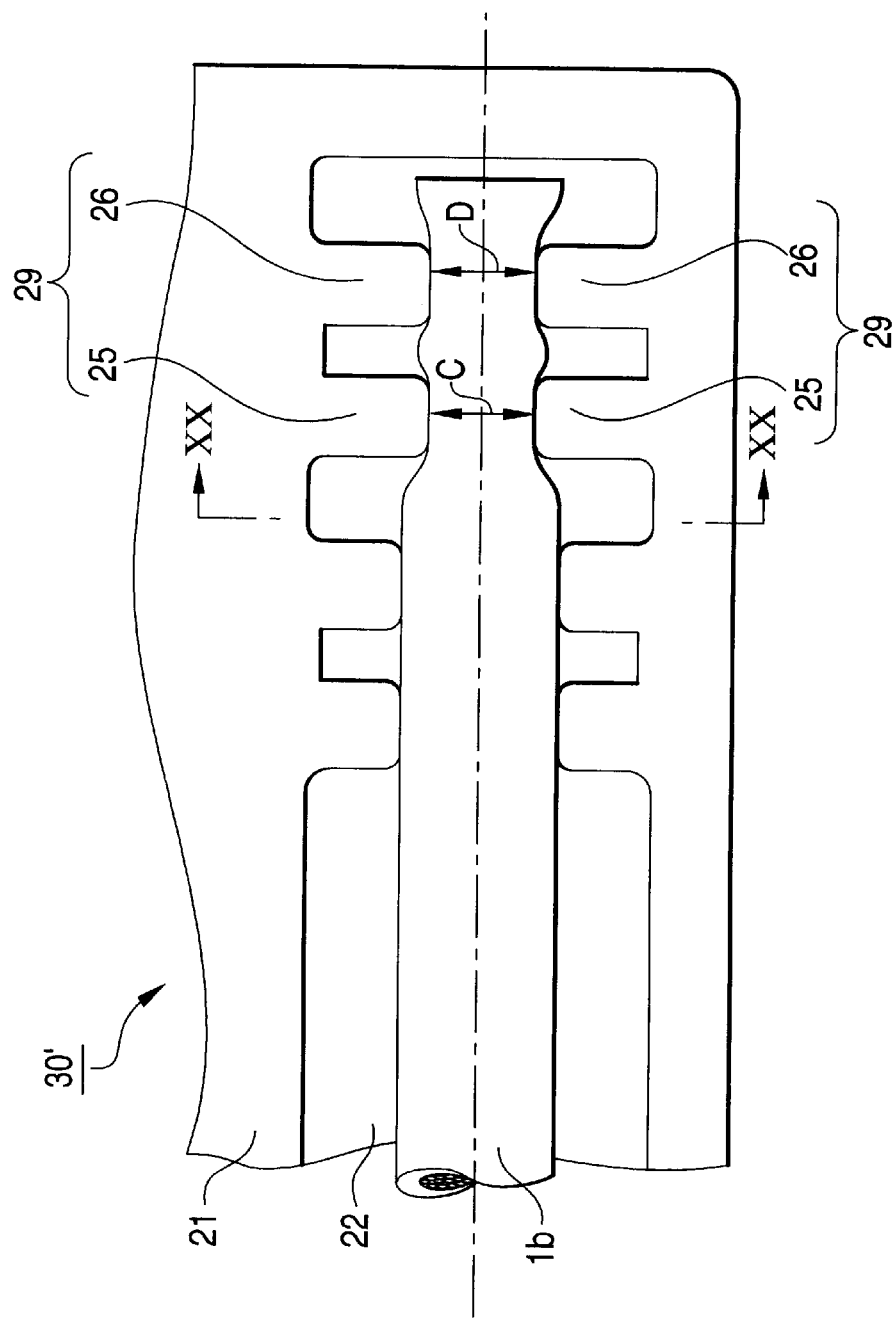
FIG. 19 is a plan view of the wire holding structure of FIG. 16, showing a thin wire in a held condition.

Next, the insertion of a thin wire 1b into the wire receiving groove 22 will be described. As shown in FIGS. 19 and 20, an end portion of the thin wire 1b is inserted into the wire receiving portion 22, and is linearly inserted between the second wire gripping piece portions 25 and between the second wire gripping piece portions 26, and this end portion is held in the slot widths C and D of the second wire gripping piece portions 25 and 26 in such a manner that this end portion is compressively deformed from the initial outer diameter of the thin wire 1b. Therefore, the thin wire 1b is positively held in the wire receiving groove 22, and is prevented from being withdrawn in the longitudinal direction of the wire receiving groove and the upward direction.

As described above, the thick wire-gripping portion 28 for the thick wire, comprising the two pair of first wire gripping piece portions 23 and 24, and the thin wire-gripping portion 29 for the thin wire, which comprises the second wire gripping piece portions 25 and 26, and is disposed adjacent to the thick wire-gripping portion 28, are provided on the same centerline on the same wire receiving groove 22, and therefore the thick wire-gripping portion 28 and the thin wire-gripping portion 29 can be selectively used in accordance with the outer diameter of the sheathed wire to be used.

Therefore, in accordance with a selected one of various (at least two) kinds of wire diameters, the sheathed wire of the selected diameter can be positively held by the wire gripping portion 28 or 29.

In the wire holding structure 30' of this embodiment, although the two wire gripping portions, that is, the thick wire-gripping portion and the thin wire-gripping portion, are arranged adjacent to each other along the wire receiving groove 22, another wire gripping portion can be added such that the three wire gripping portions are arranged serially.

Although the structure for holding the end portion of the sheathed wire have been described, the present invention can be applied to a wire gripping portion which is provided at a central portion of the wiring board 21 so as to hold an intermediate portion of the sheathed wire, and with this construction the sheathed wire can be more firmly held on the wiring board 21.

In the wire holding structure 30' of this embodiment, the inner end portions of the second wire gripping piece portions 25 and 26 of the thin wire-gripping portion 29 are cut off at the cutting portions 40 so that the slot widths C and D of the second wire gripping piece portions 25 and 26 can correspond to the slot widths A and B of the thick wire-gripping portion 28. The amount of the cutting portions 40 is determined in accordance with the wire diameter, and in the case of a relatively-thin wire, the amount of the cutting portions 40 is small, and in the case of a relatively-thick wire, the amount of the cutting portions 40 is large. Therefore, when the slot widths C and D of the second wire gripping piece portions 25 and 26 of the thin wire-gripping portion 29 are set to a small value, the number of wire diameters, which can be used, can be increased.

As described above, in the third embodiment of the wire holding structure of the present invention, the wire gripping portion is divided into the thick wire-gripping portion for the thick wire and the thin wire-gripping portion for the thin wire in accordance with the outer diameter of the sheathed wire, and these wire gripping portions are arranged serially on the same centerline of the wire receiving groove. The opposition space of the thin wire-gripping portion can be increased to correspond to the opposition space of the thick wire-gripping portion, and the opening is formed in the bottom surface of the wire receiving groove.

Therefore, when inserting the thick wire, this wire is inserted into the thick wire-gripping portion, and the opposition space of each pair of wire gripping piece portions of the thin wire-gripping portion is increased to correspond to the opposition space of the thick wire-gripping portion by cutting the inner end portions of these wire gripping piece portions, and by doing so, the thick wire can be inserted also between each pair of wire gripping piece portions of the thin wire-gripping portion.

Since the opening is formed in the bottom surface of the wire receiving groove, the cutting pieces of the wire gripping piece portions can be discharged through this opening, so that the efficiency of the operation is enhanced. Therefore, the various wires, having the relatively wide range of wire diameters, can be held rapidly and firmly, and particularly the thick wire can be positively prevented from being withdrawn in the longitudinal direction of the wire receiving groove and the upward direction, and the wiring board and a connector, having an excellent versatility, can be obtained.

In the wire holding structure of the third embodiment, the thick wire-gripping portion comprises the two pairs of first wire gripping piece portions having the relatively wide opposition space, and the thin wire-gripping portion comprises the two pairs of second wire gripping piece portions having the relatively narrow opposition space.

Thus, each wire gripping portion comprises the two pair of wire gripping piece portions, and therefore when either of the thick wire and the thin wire is inserted, the wire can be more firmly held in the wire receiving groove. Therefore, a selected one of various kinds of sheathed wires of different diameters can be firmly held, and the wire is prevented from being withdrawn in the longitudinal direction of the wire receiving groove and the upward direction, and the wiring board and a connector, having an excellent versatility, can be obtained.

It is contemplated that numerous modifications may be made to the wire holding structures of the present invention without departing from the spirit and scope of the invention as defined in the following claims.

What is claimed is:

1. A wire holding structure, comprising:
   a wiring board;
   a wire receiving groove, formed in the wiring board, for linearly mounting a sheathed wire therein;
   at least two pair of opposed wire gripping piece portions for gripping the sheathed wire, provided in a predetermined position on the wire receiving groove, said at least two pair of opposed wire gripping portions including a pair of first opposed wire gripping piece portions and a pair of second opposed wire gripping piece portions, wherein a slot width formed across the wire receiving groove between the pair of first wire gripping piece portions is larger than a slot width between the pair of second wire gripping piece portions; and
   an interconnecting portion interconnecting at least one pair of the at least two pair of wire gripping piece portions, the interconnecting portion being provided at a region below the wire gripping piece portions.

2. A wire holding structure, comprising:
   a wiring board;
   a wire receiving groove, formed in the wiring board, for linearly mounting one of a thick sheathed wire and a thin sheathed wire therein;
   a pair of opposed, first wire gripping piece portions, for gripping the thick sheathed wire, provided in a first predetermined position on the wire receiving groove;
   a pair of opposed, second wire gripping piece portions, provided in a second predetermined position on the wire receiving groove, for gripping the thin sheathed wire, the second wire gripping piece portions being disposed adjacent to the first wire gripping portions, so that the first and second wire gripping piece portions are arranged serially on the wire receiving groove,
   wherein a centerline between the first wire gripping piece portions and a centerline between the second wire gripping piece portions coincide with each other;
   a first interconnecting portion interconnecting the first wire gripping piece portions, the first interconnecting portion being provided at a region below the first wire gripping piece portions; and
   a second interconnecting portion interconnecting the second wire gripping piece portions, the second interconnecting portion being provided at a region below the second wire gripping piece portions.

3. The wire holding structure of claim 2, wherein the second wire gripping piece portions can have an increased width therebetween for corresponding to a width between the first wire gripping piece portions.

4. A wire holding structure, comprising:
   a wiring board;
   a wire receiving groove, formed in the wiring board, for linearly mounting one of a thick sheathed wire and a thin sheathed wire therein;
   a pair of opposed, first wire gripping piece portions, for gripping the thick sheathed wire, provided in a first predetermined position on the wire receiving groove; and
   a pair of opposed, second wire gripping piece portions, provided in a second predetermined position on the wire receiving groove, for gripping the thin sheathed wire, the second wire gripping piece portions being disposed adjacent to the first wire gripping piece portions, so that the first and second wire gripping piece portions are arranged serially on the wire receiving groove,
   wherein a centerline between the first wire gripping piece portions and a centerline between the second wire gripping piece portions coincide with each other, and
   wherein an opening is formed in a bottom surface of the wire receiving groove.

5. The wire holding structure of claim 4, wherein the second wire gripping piece portions can have an increased width therebetween for corresponding to a width between the first wire gripping piece portions.

6. A wire holding structure, comprising:
   a wiring board;
   a wire receiving groove, formed in the wiring board, for linearly mounting one of a thick sheathed wire and a thin sheathed wire therein;
   two pairs of opposed, first wire gripping piece portions, for gripping the thick sheathed wire, provided in first predetermined positions on the wire receiving groove; and
   two pair of opposed, second wire gripping piece portions, provided in second predetermined positions on the wire receiving groove, for gripping the thin sheathed wire, the second wire gripping piece portions being disposed adjacent to the first wire gripping piece portions, so that the first and second wire gripping piece portions are arranged serially on the wire receiving groove,
   wherein a centerline between the respective first wire gripping piece portions and a centerline between the respective second wire gripping piece portions coincide with each other, and
   wherein an opening is formed in a bottom surface of the wire receiving groove.

7. The wire holding structure of claim 6, wherein each pair of the second wire gripping piece portions can have an increased width therebetween for corresponding to a width between each pair of the first wire gripping piece portions.

8. The wire holding structure according to claim 1, wherein the pair of second wire gripping piece portions are formed at an inner part of the wire receiving portion with respect to the pair of first wire portions.

* * * * *